(12) United States Patent

Tombez et al.

(10) Patent No.: US 12,601,794 B2
(45) Date of Patent: Apr. 14, 2026

(54) DEVICE AND METHOD FOR DETERMINING AN ORIENTATION OF A MAGNET, AND A JOYSTICK

(71) Applicant: Melexis Technologies SA, Bevaix (CH)

(72) Inventors: Lionel Tombez, Bevaix (CH); Nicolas Dupre, Bevaix (CH); Eric Lahaye, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 153 days.

(21) Appl. No.: 18/488,595

(22) Filed: Oct. 17, 2023

(65) Prior Publication Data

US 2024/0133978 A1 Apr. 25, 2024
US 2024/0230793 A9 Jul. 11, 2024

(30) Foreign Application Priority Data

Oct. 19, 2022 (EP) .................................... 22202618

(51) Int. Cl.
*G01R 33/022* (2006.01)
*G01B 7/00* (2006.01)
*G06F 3/0338* (2013.01)

(52) U.S. Cl.
CPC .......... *G01R 33/022* (2013.01); *G01B 7/003* (2013.01); *G06F 3/0338* (2013.01)

(58) Field of Classification Search
CPC ............................... G01R 33/022; G01B 7/003
See application file for complete search history.

(56) References Cited

U.S. PATENT DOCUMENTS

| | | | | |
|---|---|---|---|---|
| 11,098,996 | B2 * | 8/2021 | Lugani | ................... G01D 5/145 |
| 2008/0258722 | A1 * | 10/2008 | Zon | ......................... G01R 33/09 |
| | | | | 324/260 |
| 2016/0334830 | A1 | 11/2016 | Sirohiwala et al. | |
| 2020/0271479 | A1 | 8/2020 | Wang et al. | |
| 2021/0110239 | A1 | 4/2021 | Heinz et al. | |

FOREIGN PATENT DOCUMENTS

| | | |
|---|---|---|
| EP | 3875915 A1 | 9/2021 |
| EP | 4019905 A1 | 6/2022 |
| EP | 4105768 A1 | 12/2022 |

OTHER PUBLICATIONS

Extended European Search Report from corresponding EP Application No. 22202618.9, Apr. 11, 2023.

* cited by examiner

*Primary Examiner* — Reena Aurora
(74) *Attorney, Agent, or Firm* — Workman Nydegger

(57) ABSTRACT

A method of determining an orientation of a magnet which is pivotable about a reference position having a predefined position relative to a silicon substrate, includes: providing a silicon substrate; determining a first/second magnetic field gradient along a first/second direction; determining a first/second angle based on said first/second magnetic field gradient and a first/second correction value. A sensor device configured for performing this method. A sensor system includes such sensor device and a magnet, optionally connected to a joystick.

14 Claims, 18 Drawing Sheets

Bz1=h1; Bz2=h2; Bz3=h4; Bz4=h4;
Bx5=(v1+v3); By5=(v2+v4); Bz5=h5;
dBzdx=(Bz1-Bz3);
dBzdy=(Bz2-Bz4);
D2=sqr(Bx5)+sqr(By5)+sqr(Bz5)
----

α=f21(dBzdx,D2);     β=f22(dBzdy,D2)
e.g. α=f23(dBzdx,√D2);     β=f24(dBzdy,√D2)
e.g. α=f25(dBzdx/√D2);     β=f26(dBzdy/√D2)
e.g. α=arcsin(dBzdx/√D2);     β=arcsin(dBzdy/√D2)

603

$$Bx=B*Cos(Alpha)*Sin(Beta)$$
$$By=B*Cos(Beta)*Sin(Alpha)$$
$$Bz=B*Sin(Beta)*Sin(Alpha)$$

Bx=(h3-h1)
By=(h2-h4)
Bz=(h1+h3) or (h2+h4) or (h1+h2+h3+h4)

Bx=v1 or v3 or (v1+v3)
By=v2 or v4 or (v2+v4)
Bz=h1

Bz1=h1; Bz2=h2; Bz3=h4; Bz4=h4;
dBzdx=(Bz1-Bz3);
dBzdy=(Bz2-Bz4)
D1=Temp_compensation_value=f10(Temp)
---
     α=f11(dBzdx,D1);      β=f12(dBzdy,D1)
e.g. α=f13(dBzdx/D1);      β=f14(dBzdy/D1)
e.g. α=arcsin(dBzdx/D1);    β=arcsin(dBzdy/D1)

Bz1=h1; Bz2=h2; Bz3=h4; Bz4=h4;
Bx5=(v1+v3); By5=(v2+v4); Bz5=h5;
dBzdx=(Bz1-Bz3);
dBzdy=(Bz2-Bz4);
D2=sqr(Bx5)+sqr(By5)+sqr(Bz5)
----

α=f21(dBzdx,D2);      β=f22(dBzdy,D2)
e.g. α=f23(dBzdx,√D2);    β=f24(dBzdy,√D2)
e.g. α=f25(dBzdx/√D2);    β=f26(dBzdy/√D2)
e.g. α=arcsin(dBzdx/√D2); β=arcsin(dBzdy/√D2)

Bz1=h1; Bz2=h2; Bz3=h4; Bz4=h4;
Bx5=(h5-h7); By5=(h8-h6); Bz5=(h5+h6+h7+h8);
dBzdx=(Bz1-Bz3);
dBzdy=(Bz2-Bz4);
D2=sqr(Bx5)+sqr(By5)+sqr(Bz5)
----

$\alpha$=f31(dBzdx,D2);     $\beta$=f32(dBzdy,D2)
e.g. $\alpha$=f33(dBzdx,$\sqrt{}$D2);     $\beta$=f34(dBzdy,$\sqrt{}$D2)
e.g. $\alpha$=f35(dBzdx/$\sqrt{}$D2);     $\beta$=f36(dBzdy/$\sqrt{}$D2)
e.g. $\alpha$=arcsin(dBzdx/$\sqrt{}$D2);   $\beta$=arcsin(dBzdy/$\sqrt{}$D2)

Bx1=(h1-h3);     By1=(h2-h4);     Bz1=(h1+h2+h3+h4);

Bx2=(h5-h7);     By2=(h6-h9);     Bz2=(h5+h6+h7+h9);

Bx3=(h9-h11);     By3=(h10-h12);    Bz3=(h9+h10+h11+h12);

Bx4=(h13-h15);    By4=(h14-h16);    Bz4=(h13+h14+h15+h15);

dBxdx=(Bx1-Bx3); dBydx=(By1-By3); dBzdx=(Bz1-Bz3);

dBxdy=(Bx4-Bx2); dBydy=(By4-By2); dBzdy=(Bz4-Bz2);

D3=sqr(dBxdx)+sqr(dBydx)+sqr(dBzdx)

D4=sqr(dBxdy)+sqr(dBydy)+sqr(dBzdy)

----

α=f41(dBzdx,D3);      β=f42(dBzdy,D4)

e.g. α=f43(dBzdx,√D3);     β=f44(dBzdy,√D4)

e.g. α=f45(dBzdx/√D3);     β=f46(dBzdy/√D4)

e.g. α=arcsin(dBzdx/√D3);   β=arcsin(dBzdy/√D4)

Bx1=(v1+v2);    By1=(v3+v4);    Bz1=(h1);
Bx2=(v5+v6);    By2=(v7+v8);    Bz2=(h2);
Bx3=(v9+v10);    By3=(v11+v12); Bz3=(h3);
Bx4=(v13+v14); By4=(v15+v16); Bz4=(h4);
dBxdx= (Bx1-Bx3); dBydx=(By1-By3); dBzdx=(Bz1-Bz3);
dBxdy= (Bx4-Bx2); dBydx=(By4-By2); dBzdy=(Bz4-Bz2);
D3=sqr(dBxdx)+sqr(dBydx)+sqr(dBzdx)
D4=sqr(dBxdy)+sqr(dBydy)+sqr(dBzdy)
-----
    α=f41(dBzdx,D3);       β=f42(dBzdy,D4)
e.g. α=f43(dBzdx,√D3);      β=f44(dBzdy,√D4)
e.g. α=f45(dBzdx/√D3);      β=f46(dBzdy/√D4)
e.g. α=arcsin(dBzdx/√D3);   β=arcsin(dBzdy/√D4)

Bz1=h1; Bz2=h2; Bz3=h3; Bz4=h4; Bz5=h5;
dBzdx=(Bz3-Bz1); d2Bzdx2=(Bz3-Bz5)-(Bz5-Bz1)=(Bz1-2*Bz5+Bz3)
dBzdy=(Bz2-Bz4); d2Bzdy2=(Bz2-Bz5)-(Bz5-Bz4)=(Bz4-2*Bz5+Bz2)
D5=d2Bzdx2;
D6=d2Bzdy2;
---
$\alpha$=f51(dBzdx,D5);        $\beta$=f52(dBzdy,D6)
e.g. $\alpha$=f53(dBzdx/D5);        $\beta$=f54(dBzdy/D6)
e.g. $\alpha$=atan2(dBzdx, d2Bzdx2);  $\beta$=atan2(dBzdy,d2Bzdy2)

$Bx1=v1$; $By2=v2$; $Bx3=v3$; $By4=v4$;

$Bx5=(v5+v7)$; $By5=(v6+v8)$;

$dBxdx=(Bx1-Bx3)$; $d2Bxdx2=(Bx3-Bx5)-(Bx5-Bx1)=(Bx1-2*Bx5+Bx3)$;

$dBydy=(By4-By2)$; $d2Bydy2=(By2-By5)-(By5-By4)=(By4-2*By5+By2)$;

$D7=d2Bxdx2$;

$D8=d2Bydy2$;

-----

$\alpha=f91(dBxdx,D7)$;                    $\beta=f92(dBydy,D8)$ e.g. $\alpha=f93(dBxdx/D7)$;              $\beta=f94(dBydy/D8)$ e.g. $\alpha=arccotan2(dBxdx/d2Bxdx2)$;   $\beta=arccotan(dBydy/d2Bydy2)$

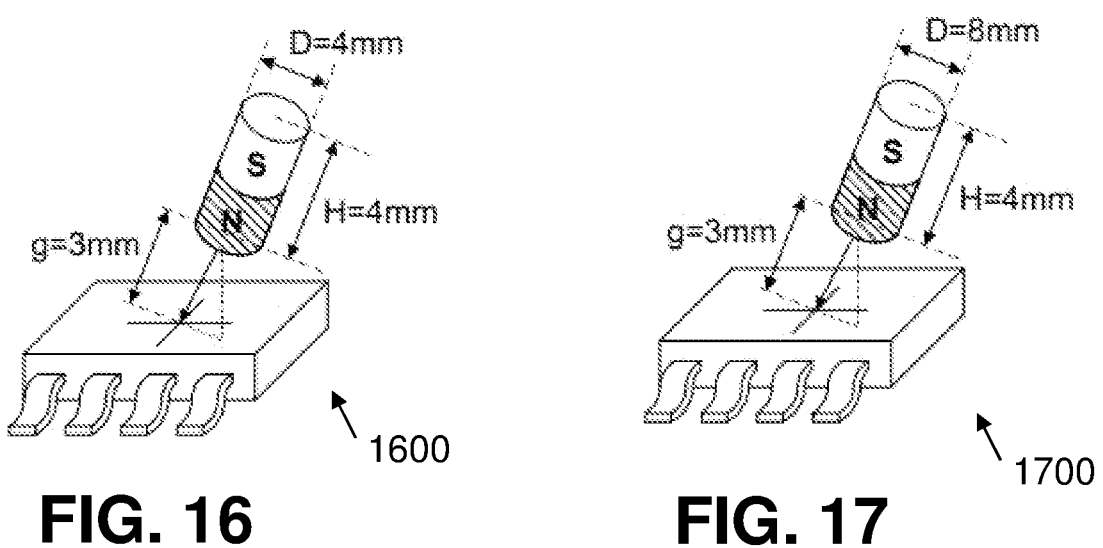
FIG. 16          FIG. 17
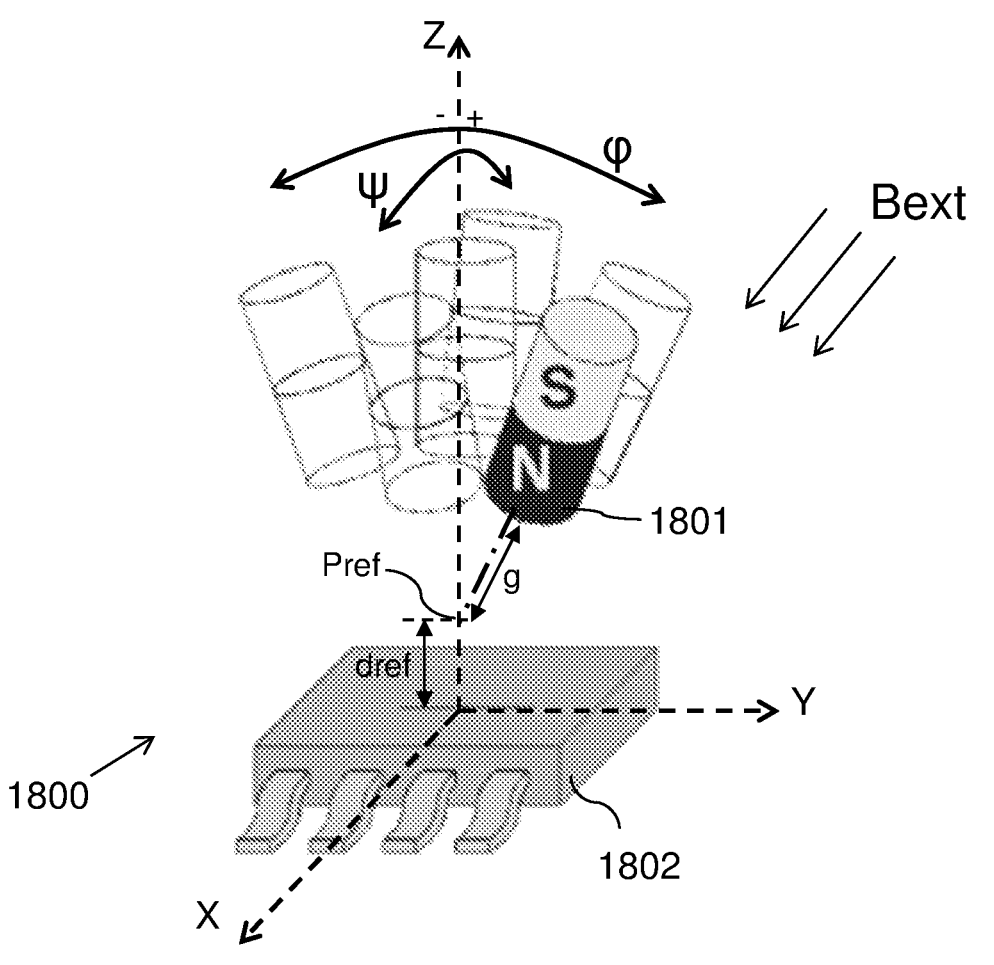
FIG. 18

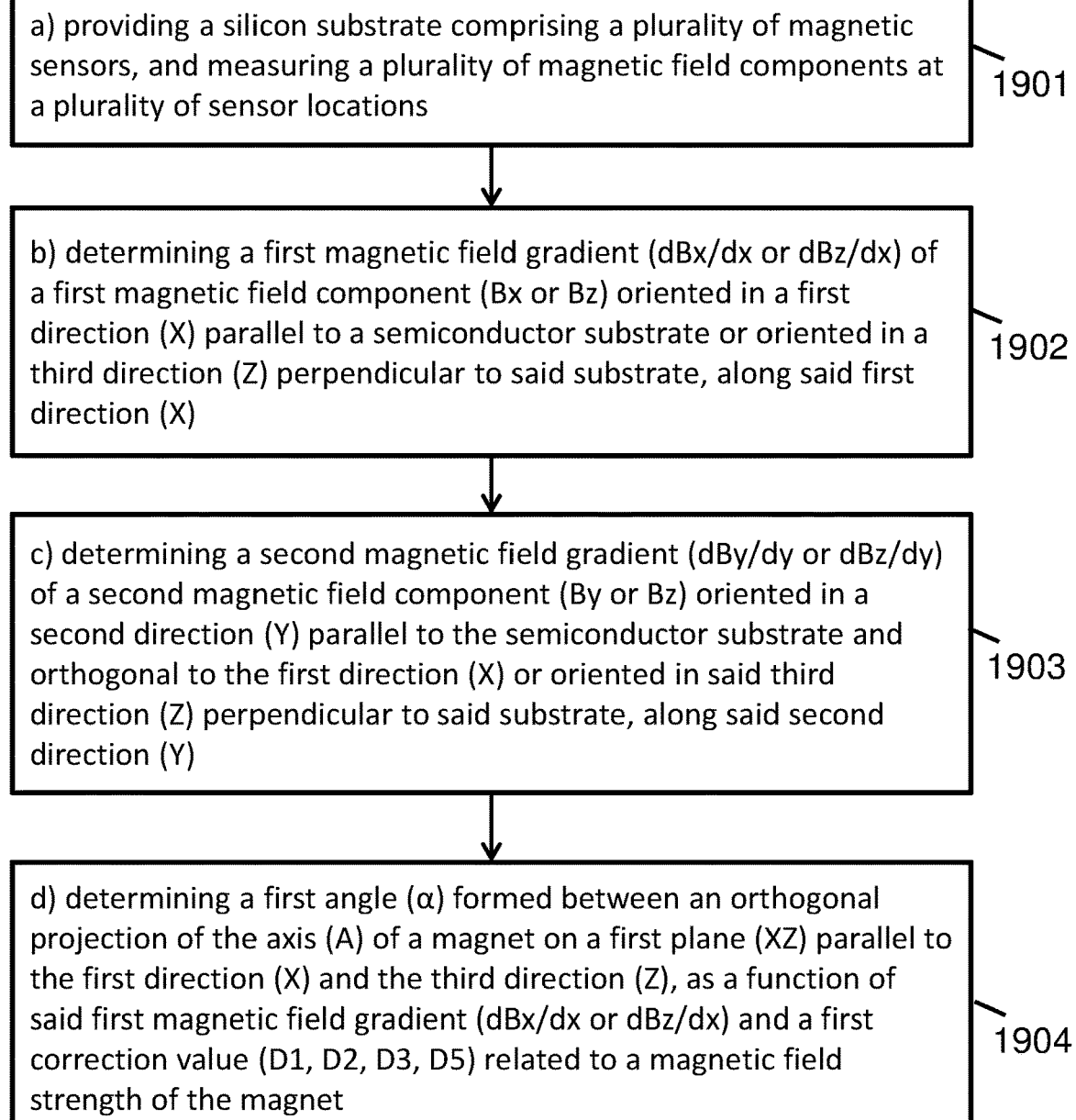

a) providing a silicon substrate comprising a plurality of magnetic sensors, and measuring a plurality of magnetic field components at a plurality of sensor locations                    1901 b) determining a first magnetic field gradient (dBx/dx or dBz/dx) of a first magnetic field component (Bx or Bz) oriented in a first direction (X) parallel to a semiconductor substrate or oriented in a third direction (Z) perpendicular to said substrate, along said first direction (X)                    1902 c) determining a second magnetic field gradient (dBy/dy or dBz/dy) of a second magnetic field component (By or Bz) oriented in a second direction (Y) parallel to the semiconductor substrate and orthogonal to the first direction (X) or oriented in said third direction (Z) perpendicular to said substrate, along said second direction (Y)                    1903 d) determining a first angle (α) formed between an orthogonal projection of the axis (A) of a magnet on a first plane (XZ) parallel to the first direction (X) and the third direction (Z), as a function of said first magnetic field gradient (dBx/dx or dBz/dx) and a first correction value (D1, D2, D3, D5) related to a magnetic field strength of the magnet                    1904 e) determining a second angle (β) formed between an orthogonal projection of the axis (A) of the magnet on a second plane (YZ) parallel to the second direction (Y) and the third direction (Z), as a function of said second magnetic field gradient (dBy/dy or dBz/dy) and a second correction value (D1, D2, D4, D6) related to a magnetic field strength of the magnet                    1905

FIG. 19        1900 a) providing a silicon substrate comprising a plurality of magnetic sensors, and measuring a plurality of magnetic field components at a plurality of sensor locations                                      2001 b) determining a first magnetic field gradient (dBz/dx) of a magnetic field component (Bz) oriented in a direction (Z) perpendicular to a substrate, along a first direction (X) parallel to the substrate                                      2002 c) determining a second magnetic field gradient (dBz/dy) of said magnetic field component (Bz) oriented in said direction (Z) perpendicular to a substrate, along a second direction (Y) parallel to the substrate and perpendicular to the first direction (X)                                      2003 d) determining a first angle (α) formed between an orthogonal projection of the axis (A) of a magnet on a first plane (XZ) parallel to the first direction (X) and the third direction (Z), as a function of said first magnetic field gradient (dBz/dx) and a first correction value (D1, D2, D3) indicative of a magnetic field strength of the magnet                                      2004 e) determining a second angle (β) formed between an orthogonal projection of the axis (A) of the magnet on a second plane (YZ) parallel to the second direction (Y) and the third direction (Z), as a function of said second magnetic field gradient (dBz/dy) and a second correction value (D1, D2, D4) indicative of a magnetic field strength of the magnet                                      2005

FIG. 20           2000 a) providing a silicon substrate comprising a plurality of magnetic sensors, and measuring a plurality of magnetic field components at a plurality of sensor locations — 2101 b) determining a first magnetic field gradient (dBx/dx or dBz/dx) of a first magnetic field component (Bx or Bz) oriented in a first direction (X) parallel to a semiconductor substrate or oriented in a third direction (Z) perpendicular to said substrate, along said first direction (X) — 2102 c) determining a second magnetic field gradient (dBy/dy or dBz/dy) of a second magnetic field component (By or Bz) oriented in a second direction (Y) parallel to the semiconductor substrate and orthogonal to the first direction (X) or oriented in the third direction (Z) perpendicular to said substrate, along said second direction (Y) — 2103 d) determining a first angle (α) formed between an orthogonal projection of the axis (A) of a magnet on a first plane (XZ) parallel to the first direction (X) and the third direction (Z), as a function of said first magnetic field gradient (dBx/dx or dBz/dx) and a second order gradient ($d^2Bx/dx^2$ or $d^2Bz/dx^2$) of the first magnetic field component (Bx or Bz) along the first direction (X) — 2104 e) determining a second angle (β) formed between an orthogonal projection of the axis (A) of the magnet on a second plane (YZ) parallel to the second direction (Y) and the third direction (Z), as a function of said second magnetic field gradient (dBy/dy or dBz/dy) and a second order gradient ($d^2By/dy^2$ or $d^2Bz/dy^2$) of the second magnetic field component (By or Bz) along the second direction (Y) — 2105

FIG. 21      2100

DEVICE AND METHOD FOR DETERMINING AN ORIENTATION OF A MAGNET, AND A JOYSTICK

FIELD OF THE INVENTION

The present invention relates in general to the field of magnetic position sensor systems, devices and methods, and more in particular to magnetic position sensor systems for measuring an orientation of a magnet which is pivotable about a fixed reference point. The present invention is also related to a position sensor system wherein said magnet is connected to a joystick.

BACKGROUND OF THE INVENTION

Magnetic position sensor systems, in particular linear or angular position sensor systems are known in the art. Many variants of position sensor systems exist, addressing one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), having only one degree of freedom (e.g. translation or rotation), having two degrees of freedom (e.g. one translation and one rotation, or two rotations), etc.

In many known systems, the system has only one degree of motional freedom, e.g. rotation about a single axis, or translation along a single axis.

Magnetic position sensor systems where the magnet has at least two degrees of freedom, are also known in the art, for example from EP21159804.0 filed on 28 Feb. 2021 disclosing a magnet movable along an axis and rotatable about said axis; or from US2021/0110239(A1) disclosing a circuit comprising at least one trained neural network for determining information about a position, attitude, or orientation of a magnet. These examples show that position sensor systems wherein the magnet has at least 2 degrees of freedom are much more complicated than systems having only 1 degree of freedom.

There is always room for improvements or alternatives.

SUMMARY OF THE INVENTION

It is an object of embodiments of the present invention to provide a sensor device, a position sensor system, and a method for determining an orientation $(\alpha,\beta)$ of a magnet.

It is an object of embodiments of the present invention to provide a sensor device, a position sensor system, and a method for determining an orientation $(\alpha,\beta)$ of a cylindrical magnet which is pivotable about a fixed reference point. The fixed reference point may be situated at a predefined height above or below a semiconductor substrate ("above" meaning at the same side of the substrate as the magnet, "below" meaning at the opposite side of the substrate as the magnet).

It is a object of particular embodiments of the present invention to provide a sensor device, a position sensor system, and a method for determining an orientation $(\alpha,\beta)$ of an axis of an axially magnetized cylindrical magnet which is pivotable about a reference position located on a semiconductor substrate.

In preferred embodiments, the orientation of the magnet is determined in a manner which is highly accurate and has a reduced sensitivity to one or more or all of the following: temperature variations, mounting tolerances, demagnetization of the magnet, an external disturbance field (also known as "strayfield").

It is a object of particular embodiments of the present invention to provide a joystick comprising such a magnet, wherein an orientation of the joystick is determined with improved accuracy.

These and other objectives are accomplished by embodiments of the present invention.

According to a first aspect, the present invention provides a sensor device for determining an orientation (e.g. $\alpha,\beta$) of a magnet having an axis, the sensor device comprising: a silicon substrate comprising a plurality of magnetic sensors; a processing circuit configured for: a) determining a first magnetic field gradient (e.g. dBx/dx; dBz/dx) of a first magnetic field component (e.g. Bx; Bz) oriented in a first direction (e.g. X) parallel to the silicon substrate or oriented in a third direction (e.g. Z) perpendicular to said substrate, along said first direction (e.g. X); b) determining a second magnetic field gradient (e.g. dBy/dy; dBz/dy) of a second magnetic field component (e.g. By; Bz) oriented in a second direction (e.g. Y) parallel to the silicon substrate and perpendicular to the first direction (e.g. X) or oriented in the third direction (e.g. Z) perpendicular to said substrate, along said second direction (e.g. Y); c) determining a first angle (e.g. a) as a function of said first magnetic field gradient (e.g. dBx/dx; dBz/dx) and a first correction value (e.g. D1, D2, D3, D5, D7); d) determining a second angle (e.g. $\beta$) as a function of said second magnetic field gradient (e.g. dBy/dy; dBz/dy) and a second correction value (e.g. D1, D2, D4, D6, D8).

Preferably, the first correction value is different from dBx/dx and different from dBz/dx, and the second correction value is different from dBy/dy and different from dBz/dy.

It was found that the orientation thus determined has an improved accuracy, and has a reduced sensitivity to one or more or all of the following: temperature variations, mounting tolerances, an external disturbance field, magnet demagnetisation, etc.

The first correction value and the second correction value may be selected from the group consisting of: a predefined function of temperature, a sum of squares of three orthogonal magnetic field components (Bx, By, Bz), a sum of squares of three orthogonal magnetic field gradients (dBx/dx, dBy/dx, dBz/dx) along the first direction (X), a sum of squares of three orthogonal magnetic field gradients (dBx/dy, dBy/dy, dBz/dy) along the second direction (Y), a second order gradient ($d^2Bx/dx^2$; $d^2Bz/dx^2$) of the first magnetic field component (Bx; Bz) along the first direction (X), and a second order gradient ($d^2By/dy^2$; $d^2Bz/dy^2$) of the second magnetic field component (By; Bz) along the second direction (Y).

It is noted that "silicon substrate comprising a plurality of magnetic sensors" does not necessarily mean that the sensors are embedded in the silicon substrate, although they may, and does not necessarily mean that the sensors have to be made of silicon. Indeed, the magnetic sensors may be formed on top of the silicon substrate, and may comprise materials different from silicon, e.g. a ferromagnetic material (xMR), or a semiconductor compound (e.g. a III-V compound).

The first correction value may be related (e.g. indicative) of the magnetic field strength of the magnet, and/or may be substantially independent of the orientation of the magnet.

The second correction value may be related (e.g. indicative) of the magnetic field strength of the magnet, and/or may be substantially independent of the orientation of the magnet.

Preferably the silicon substrate has an area smaller than 9.0 mm$^2$, or smaller than 7.0 mm$^2$, or smaller than 5.0 mm$^2$, or smaller than 4.0 mm$^2$.

In an embodiment, the sensor device comprises four sensor locations, e.g. located on a virtual circle, and angularly spaced by multiples of 90°.

In an embodiment, the sensor device comprises five sensor locations, four sensor locations being located on a virtual circle and angularly spaced by multiples of 90°, and a firth sensor location situated in the centre of the virtual circle.

In an embodiment, the sensor device comprises four 1D magnetic pixels, for example four Horizontal Hall elements without a magnetic flux concentrator (e.g. as illustrated in FIG. 5A).

In an embodiment, the sensor device comprises four 3D magnetic pixels (e.g. as illustrated in FIG. 8 and FIG. 9).

In an embodiment, the sensor device comprises five 1D magnetic pixels, for example five Horizontal Hall elements without a magnetic flux concentrator (e.g. as illustrated in FIG. 11).

In an embodiment, the sensor device comprises four 1D magnetic pixels located on a virtual circle and spaced apart by multiples of 90°, and one 2D magnetic pixel located in the centre (e.g. as illustrated in FIG. 14). This sensor device may comprise only vertical Hall elements, or only magnetoresistive (MR) elements, or vertical Hall elements and MR elements.

In an embodiment, the first/second angle is determined as a function of a product of the first/second magnetic field gradient and the first/second correction value.

In an embodiment, the first/second angle is determined as a function of a ratio of the first/second magnetic field gradient and the first/second correction value.

In an embodiment, the first/second angle is determined as a function of a ratio of the first/second magnetic field gradient and the square root of said sum of squares.

In an embodiment, the function is a goniometric function, e.g. an arctangent function, an arcsine function, or an arcotangent function.

The magnet may be a cylindrical magnet.

The magnet may be a two-pole magnet, e.g. a cylindrical two-pole magnet, or a two-pole bar magnet, or a two-pole spherical magnet.

The magnet may be an axially magnetised ring magnet or an axially magnetised disk magnet.

The cylindrical magnet may have an external diameter in the range from 3.0 mm to 15.0 mm, or in the range from 4.0 mm to 12.0 mm, or in the range from 4.0 mm to 10.0 mm.

The cylindrical magnet may have a height H (in the axial direction), and an outer diameter D such that a ratio (H/D) of this height and of the external diameter is a value in the range from 20% to 100%, of in the range from 20% to 80%, or in the range from 25% to 75%, e.g. equal to about 50%.

In an embodiment, step a) comprises: determining a first magnetic field gradient (e.g. dBz/dx) of a magnetic field component (e.g. Bz) oriented perpendicular to the silicon substrate, along said first direction (e.g. X); and step b) comprises: determining a second magnetic field gradient (e.g. dBz/dy) of said magnetic field component (e.g. Bz) oriented perpendicular to the substrate, along said second direction (e.g. Y); and the first and the second correction value (e.g. D1, D2, D3, D4) are selected from the group consisting of: a predefined function of temperature, a sum of squares of three magnetic field components (e.g. Bx, By, Bz), a sum of squares of three magnetic field gradients (e.g. dBx/dx, dBy/dx, dBz/dx) along the first direction (e.g. X), and a sum of squares of three magnetic field gradients (e.g; dBx/dy, dBy/dy, dBz/dy) along the second direction (e.g. Y).

In this embodiment, the first correction value and the second correction value is highly independent of the orientation of the magnet, and mainly dependent on the strength of the magnet.

In an embodiment, the sensor device is further configured for measuring a temperature; and step c) comprises: determining the first angle (e.g. α) as a function of said first magnetic field gradient (e.g. dBz/dx) and a predefined function of temperature; and step d) comprises: determining the second angle (e.g. β) as a function of said second magnetic field gradient (e.g. dBz/dy) and said predefined function of temperature.

An example of this embodiment is illustrated in FIG. 5A.

The temperature may be a temperature obtained from an internal temperature sensor incorporated in the sensor device, e.g. embedded in the silicon substrate, or may be a temperature obtained from an external temperature sensor (e.g. mounted to the magnet, or mounted in the vicinity of the magnet) and electrically connected to the sensor device.

The predefined function may be stored in a non-volatile memory of the sensor device, e.g. in the form of a look-up table, or in the form of a set of coefficients of a polynomial expression, or in any other suitable way.

It is an advantage of this sensor device that the angular position is highly accurate, and has a reduced sensitivity to temperature variations, and to external disturbance field.

In an embodiment, the sensor device is further configured for measuring three orthogonal magnetic field components (e.g. Bx, By, Bz), and for determining a sum of squares of these magnetic field components; and step c) comprises: determining the first angle (e.g. α) as a function of said first magnetic field gradient (e.g. dBz/dx) and said sum of squares; and step d) comprises: determining the second angle (e.g. β) as a function of said second magnetic field gradient (e.g. dBz/dy) and said sum of squares.

Examples of this embodiment are illustrated in FIG. 6 and FIG. 7.

It is an advantage of this sensor device that the angular position is highly accurate, and has a reduced sensitivity to temperature variations, magnet demagnetization, mounting tolerances, and an external disturbance field.

In an embodiment, the sensor device is further configured for determining three orthogonal magnetic field gradients (e.g. dBx/dx, dBy/dx, dBz/dx) along the first direction (e.g. X), and for determining a first sum of squares of these gradients; and the sensor device is further configured for determining three orthogonal magnetic field gradients (e.g. dBx/dy, dBy/dy, dBz/dy) along the second direction (e.g. Y), and for determining a second sum of squares of these gradients; and step c) comprises: determining the first angle (e.g. α) as a function of said first magnetic field gradient (e.g. dBz/dx) and said first sum of squares; and step d) comprises: determining the second angle (e.g. β) as a function of said second magnetic field gradient (e.g. dBz/dy) and said second sum of squares.

Examples of this embodiment are illustrated in FIG. 8 to FIG. 10.

It was surprisingly found that the first sum of squares is highly constant for various angular positions of the first angle in the XZ-plane, and that the second sum of squares is substantially constant for various angular positions of the second angle in the YZ-plane, as illustrated in FIG. 10. As far as is known to the inventors, this is not known in the art.

In an embodiment, the sensor device is further configured for determining a second order gradient (e.g. $d^2Bx/dx^2$; $d^2Bz/dx^2$) of the first magnetic field component (e.g. Bx; Bz) along the first direction (e.g. X), and for determining a second order gradient (e.g. $d^2By/dy^2$; $d^2Bz/dy^2$) of the second magnetic field component (e.g. By; Bz) along the second direction (e.g. Y); and step c) comprises: determining the first angle (e.g. $\alpha$) as a function of said first magnetic field gradient (e.g. dBx/dx; dBz/dx) and said second order gradient (e.g. $d^2Bx/dx^2$; $d^2Bz/dx^2$) of the first magnetic field component (e.g. Bx; Bz) along the first direction (e.g. X); and step d) comprises: determining the second angle (e.g. $\beta$) as a function of said second magnetic field gradient (e.g. dBy/dy; dBz/dy) and said second order gradient (e.g. $d^2By/dy^2$; $d^2Bz/dy^2$) of the second magnetic field component (e.g. By; Bz) along the second direction (e.g. Y).

Examples of this embodiment are illustrated in FIG. 11 to FIG. 14.

It is an advantage of this sensor device that the angular position is highly accurate, and has a reduced sensitivity to temperature variations, magnet demagnetization, mounting tolerances, and an external disturbance field.

In an embodiment, step a) comprises: determining a first magnetic field gradient (e.g. dBx/dx) of a first magnetic field component (e.g. Bx) oriented in a first direction (e.g. X) parallel to the silicon substrate, along said first direction (e.g. X); and step b) comprises: determining a second magnetic field gradient (e.g. dBy/dy) of a second magnetic field component (e.g. By) oriented in a second direction (e.g. Y) parallel to the silicon substrate and perpendicular to the first direction (e.g. X), along said second direction (e.g. Y); and step c) comprises: determining the first angle (e.g. $\alpha$) as a function of said first magnetic field gradient (e.g. dBx/dx) and said second order gradient (e.g. $d^2Bx/dx^2$) of the first magnetic field component (e.g. Bx) along the first direction (e.g. X); and step d) comprises: determining the second angle (e.g. $\beta$) as a function of said second magnetic field gradient (e.g. dBy/dy) and said second order gradient (e.g. $d^2By/dy^2$) of the second magnetic field component (e.g. By) along the second direction (e.g. Y).

An example of this embodiment is illustrated in FIG. 14.

In an embodiment, step a) comprises: determining a first magnetic field gradient (e.g. dBz/dx) of a first magnetic field component (e.g. Bz) oriented perpendicular to the silicon substrate, along said first direction (e.g. X); and step b) comprises: determining a second magnetic field gradient (e.g. dBz/dy) of said first magnetic field component (e.g. Bz) oriented perpendicular to the silicon substrate, along said second direction (e.g. Y) perpendicular to the first direction; and step c) comprises: determining the first angle (e.g. $\alpha$) as a function of said first magnetic field gradient (e.g. dBz/dx) and said second order gradient (e.g. $d^2Bz/dx^2$) of the first magnetic field component (e.g. Bz) along the first direction (e.g. X); and step d) comprises: determining the second angle (e.g. $\beta$) as a function of said second magnetic field gradient (e.g. dBz/dy) and said second order gradient (e.g. $d^2Bz/dy^2$) of said first magnetic field component (e.g. Bz) along the second direction (e.g. Y).

An example of this embodiment is illustrated in FIGS. 11 to 13.

According to a second aspect, the present invention also provides a position sensor system comprising: a sensor device according to the first aspect, the sensor device comprising said silicon substrate; and a magnet pivotable about a reference point (e.g. Pref) having a predefined position relative to the silicon substrate.

In an embodiment, the system further comprises a joystick connected to the magnet.

According to a third aspect, the present invention also provides a method of determining an orientation (e.g. $\alpha,\beta$) of a magnet which is pivotable about a reference point (e.g. Pref) having a predefined position relative to a silicon substrate, the method comprising: a) providing a silicon substrate comprising a plurality of magnetic sensors, and measuring a plurality of magnetic field components at a plurality of sensor locations; b) determining a first magnetic field gradient (e.g. dBx/dx; dBz/dx) of a first magnetic field component (e.g. Bx; Bz) oriented in a first direction (e.g. X) parallel to a silicon substrate or oriented in a third direction (e.g. Z) perpendicular to said substrate, along said first direction (e.g. X); c) determining a second magnetic field gradient (e.g. dBy/dy; dBz/dy) of a second magnetic field component (e.g. By; Bz) oriented in a second direction (e.g. Y) parallel to the silicon substrate and perpendicular to the first direction (e.g. X) or oriented in the third direction (e.g. Z), along said second direction (e.g. Y); d) determining a first angle (e.g. $\alpha$) formed between an orthogonal projection of the axis of the magnet on a first virtual plane (e.g. XZ) parallel to the first direction (e.g. X) and the third direction (e.g. Z), as a function of said first magnetic field gradient (e.g. dBx/dx or dBz/dx) and a first correction value (e.g. D1, D2, D3, D5); e) determining a second angle (e.g. $\beta$) formed between an orthogonal projection of the axis of the magnet on a second virtual plane (e.g. YZ) parallel to the second direction (e.g. Y) and the third direction (e.g. Z), as a function of said second magnetic field gradient (e.g. dBy/dy or dBz/dy) and a second correction value (e.g. D1, D2, D4, D6).

The first correction value and the second correction value may be selected from the group consisting of: a predefined function of temperature, a sum of squares of three orthogonal magnetic field components (Bx, By, Bz), a sum of squares of three orthogonal magnetic field gradients (dBx/dx, dBy/dx, dBz/dx) along the first direction (X), a sum of squares of three orthogonal magnetic field gradients (dBx/dy, dBy/dy, dBz/dy) along the second direction (Y), a second order gradient ($d^2Bx/dx^2$; $d^2Bz/dx^2$) of the first magnetic field component (Bx; Bz) along the first direction (X), and a second order gradient ($d^2By/dy^2$; $d^2Bz/dy^2$) of the second magnetic field component (By; Bz) along the second direction (Y).

The first correction value may be related (e.g. indicative) of the magnetic field strength of the magnet, and/or may be substantially independent of the orientation of the magnet.

The second correction value may be related (e.g. indicative) of the magnetic field strength of the magnet, and/or may be substantially independent of the orientation of the magnet.

In an embodiment, step b) comprises: determining a first magnetic field gradient (e.g. dBz/dx) of a magnetic field component (e.g. Bz) oriented in a direction (e.g. Z) perpendicular to said substrate, along a first direction (e.g. X) parallel to the substrate; step c) comprises: determining a second magnetic field gradient (e.g. dBz/dy) of said magnetic field component (e.g. Bz) oriented in a direction (e.g. Z) perpendicular to said substrate, along said second direction (e.g. Y); step d) comprises: determining said first angle (e.g. $\alpha$) as a function of said first magnetic field gradient (e.g. dBz/dx) and said first correction value (e.g. D1, D2, D3); step e) comprises: determining said second angle (e.g.

β) as a function of said second magnetic field gradient (e.g. dBz/dy) and said second correction value (e.g. D1, D2, D4).

The first correction value and the second correction value may be selected from the group consisting of: a predefined function of temperature, a sum of squares of three orthogonal magnetic field components (Bx, By, Bz), a sum of squares of three orthogonal magnetic field gradients (dBx/dx, dBy/dx, dBz/dx) along the first direction (X), a sum of squares of three orthogonal magnetic field gradients (dBx/dy, dBy/dy, dBz/dy) along the second direction (Y).

In an embodiment, the method further comprises: determining a second order gradient (e.g. $d^2Bx/dx^2$; $d^2Bz/dx^2$) of the first magnetic field component (e.g. Bx; Bz) along the first direction (e.g. X); and the method further comprises: determining a second order gradient (e.g. $d^2By/dy^2$; $d^2Bz/dy^2$) of the second magnetic field component (e.g. By; Bz) along the second direction (e.g. Y); and step d) comprises: determining the first angle (e.g. α) as a function of said first magnetic field gradient (e.g. dBx/dx; dBz/dx) and said second order gradient (e.g. $d^2Bx/dx$ 2; $d^2Bz/dx$ 2) of the first magnetic field component (e.g. Bx; Bz) along the first direction (e.g. X); and step e) comprises: determining the second angle (e.g. β) as a function of said second magnetic field gradient (e.g. dBy/dy; dBz/dy) and said second order gradient (e.g. $d^2By/dy^2$; $d^2Bz/dy^2$) of the second magnetic field component (e.g. By; Bz) along the second direction (e.g. Y).

In an embodiment, step b) comprises: determining a first magnetic field gradient (e.g. dBx/dx) of a first magnetic field component (e.g. Bx) oriented in a first direction (e.g. X) parallel to the silicon substrate, along said first direction (e.g. X); and step c) comprises: determining a second magnetic field gradient (e.g. dBy/dy) of a second magnetic field component (e.g. By) oriented in a second direction (e.g. Y) parallel to the silicon substrate and perpendicular to the first direction (e.g. X), along said second direction (e.g. Y); and step d) comprises: determining the first angle (αe.g.) as a function of said first magnetic field gradient (e.g. dBx/dx) and said second order gradient (e.g. $d^2Bx/dx^2$) of the first magnetic field component (e.g. Bx) along the first direction (e.g. X); and step e) comprises: determining the second angle (e.g. β) as a function of said second magnetic field gradient (e.g. dBy/dy) and said second order gradient (e.g. $d^2By/dy^2$) of the second magnetic field component (e.g. By) along the second direction (e.g. Y).

In an embodiment, step b) comprises: determining a first magnetic field gradient (e.g. dBz/dx) of a first magnetic field component (e.g. Bz) oriented perpendicular to the silicon substrate, along said first direction (e.g. X); and step c) comprises: determining a second magnetic field gradient (e.g. dBz/dy) of said first magnetic field component (e.g. Bz) oriented perpendicular to the silicon substrate, along said second direction (e.g. Y) perpendicular to the first direction; and step d) comprises: determining the first angle (e.g. α) as a function of said first magnetic field gradient (e.g. dBz/dx) and said second order gradient (e.g. $d^2Bz/dx^2$) of the first magnetic field component (e.g. Bz) along the first direction (e.g. X); and step e) comprises: determining the second angle (e.g. β) as a function of said second magnetic field gradient (e.g. dBz/dy) and said second order gradient (e.g. $d^2Bz/dy^2$) of said first magnetic field component (e.g. Bz) along the second direction (e.g. Y).

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

In FIG. 4(*a*) and FIG. 4(*b*) a sensor or sensor structure is situated at said reference position. As can be seen, the magnetic field line passing through the sensor location has the same orientation as the mechanical angle of the axis, and the distance between the sensor and the magnet is independent of the orientation of the axis.

In FIG. 4(*c*) and FIG. 4(*d*) the semiconductor substrate contains a plurality of sensors or sensor structures situated at sensor positions which are spaced from the reference position. As can be seen, the orientation of the magnetic field lines at the plurality of sensor locations is not the same as the orientation of the axis, and the distance between each of the sensor locations and the magnet is not constant but is dependent of the orientation of the axis.

FIG. 16 and FIG. 17 show specific examples of the sensor system of FIG. 1.

FIG. 18 shows a variant of the sensor system of FIG. 1, where the magnet is pivotable about a reference point which is situated at a predefined non-zero distance "dref" above the substrate.

FIG. 19 shows a flow chart of a method of determining two angles α, β corresponding to the orientation of the axis of the magnet, proposed by the present invention.

FIG. 20 shows a flow chart of such a method, wherein the two angles are determined as a function of an out-of-plane magnetic field gradient and a correction value indicative of the magnetic field strength of the magnet.

FIG. 21 shows a flow chart of such a method, wherein the two angles are determined as a function of a first order gradient and a second order gradient.

Figure 1:
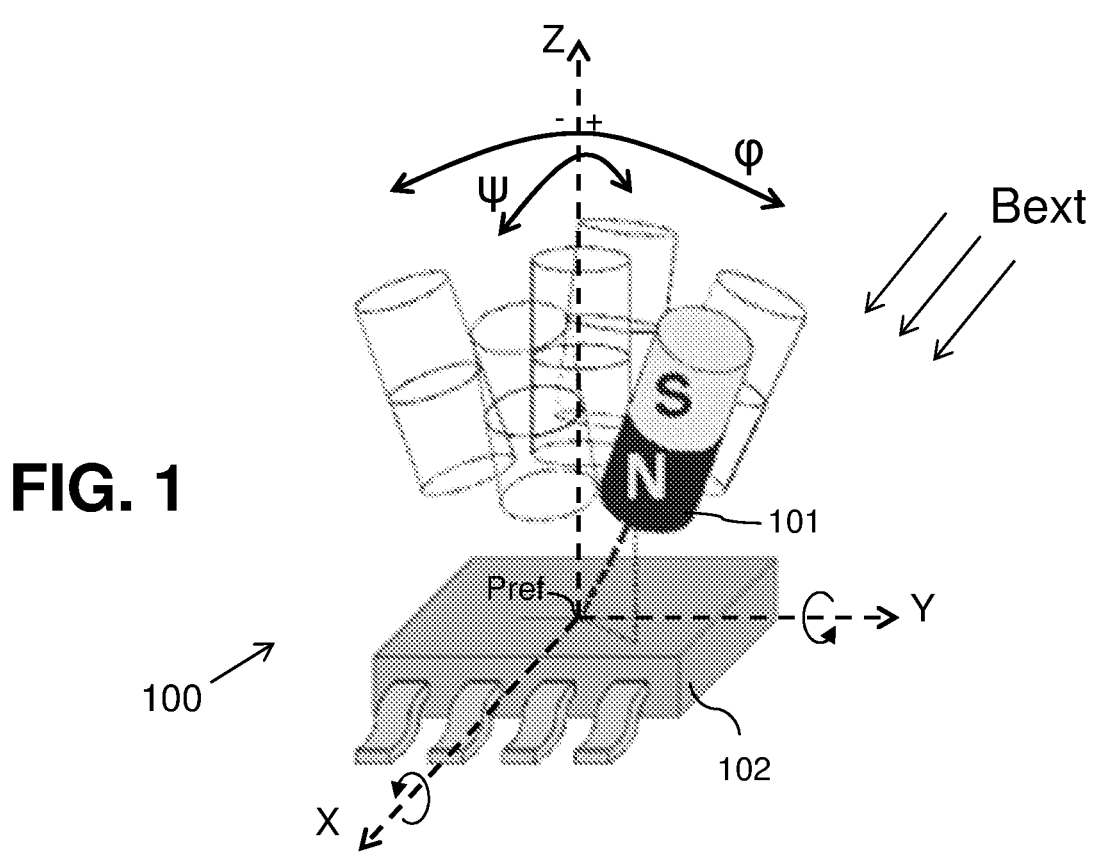
FIG. 1 is a schematic representation of a magnetic position sensor system comprising an axially magnetized magnet which is movable relative to a sensor device with at least two degrees of freedom.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, unless explicitly mentioned otherwise, the term "magnetic sensor device" or "sensor device" refers to a device comprising at least one "magnetic sensor" or at least one magnetic "sensor element", preferably integrated in a semiconductor substrate. The sensor device may be comprised in a package, also called "chip", although that is not absolutely required.

In this document, the term "sensor element" or "magnetic sensor element" or "magnetic sensor" can refer to a component or a group of components or a sub-circuit or a structure capable of measuring a magnetic quantity, such as for example a magneto-resistive element, a GMR element, an XMR element, a horizontal Hall plate, a vertical Hall plate, a Wheatstone-bridge containing at least one (but preferably four) magneto-resistive elements, etc. or combinations hereof.

In embodiments of the present invention, the term "magnetic sensor" or "magnetic sensor structure" may refer to an arrangement comprising one or more integrated magnetic concentrators (IMC), also known as integrated flux concentrators, and one or more horizontal Hall elements arranged near the periphery of the IMC, for example a disk-shaped IMC with four horizontal Hall elements angularly spaced by multiples of 90°.

In this document, the expression "in-plane component of a magnetic field vector" and "projection of the magnetic field vector in the sensor plane" mean the same. If the sensor device is or comprises a semiconductor substrate, this also means a "magnetic field component parallel to the semiconductor plane". These components may be labelled Bx, By.

In this document, the expression "out-of-plane component of a magnetic field vector" and "Z component of the vector" and "projection of the vector on an axis perpendicular to the sensor plane" mean the same. This component may be labelled Bz.

Embodiments of the present invention are typically described using an orthogonal coordinate system which is fixed to the sensor device, and having three axes X, Y, Z, where the X and Y axis are parallel to the substrate, and the Z-axis is perpendicular to the substrate.

In this document, the expression "spatial derivative" or "derivative" or "spatial gradient" or "gradient" are used as synonyms. If the order of the derivative is not explicitly mentioned, a first order gradient is meant, unless clear from the context otherwise. In the context of the present invention, the gradient is typically determined as a difference between two values measured at two locations spaced apart along a certain direction. In theory the gradient is typically calculated as the difference between two values divided by the distance between the sensor locations, but in practice the division by said distance is often omitted, because the measured signals need to be scaled anyway. Hence, in the context of the present invention, the expression "magnetic field difference" and "magnetic field gradient" can be used interchangeably.

In this application, horizontal Hall plates are typically referred to by H1, H2, etc., signals obtained from horizontal Hall plates are typically referred to by h1, h2, etc., vertical Hall plates are typically referred to by V1, V2, etc., and signals from vertical Hall plates are typically referred to by v1, v2, etc.

In the context of the present invention, the formulas arctan(x/y), a tan 2(x,y), arccot(y/x) are considered to be equivalent.

The present invention is related to magnetic position sensor systems, methods and devices for measuring an orientation of a magnet which is pivotable about a fixed reference point "Pref". This fixed reference point may be located on a semiconductor substrate or may be located at a predefined distance "dref" above or below a semiconductor substrate. The magnet may be connected to a joystick (not shown).

In preferred embodiments, the system has one or more or all of the following characteristics: improved accuracy, reduced sensitivity to temperature variations, reduced sensitivity to mounting tolerances, reduced sensitivity to demagnetization of the magnet, reduced sensitivity to an external disturbance field, and preferably all of these.

Referring to the Figures.

FIG. 1 is a schematic representation of a magnetic position sensor system 100 comprising: a cylindrical magnet 101 and a sensor device 102.

The sensor device 102 comprises a semiconductor substrate (not shown in FIG. 1). A coordinate system with three orthogonal axis X, Y, Z is connected to the semiconductor substrate, such that the axes X and Y are parallel to the semiconductor substrate, and the axis Z is orthogonal to the semiconductor substrate.

The magnet 101 shown in FIG. 1 is a cylindrical magnet, more in particular an axially magnetized two-pole magnet 101. The magnet has a virtual axis "A" which intersects the semiconductor substrate at a fixed reference point "Pref" and can rotate in various directions. The distance between the magnet 101 and the reference point "Pref" is constant, hence the system has two degrees of freedom. The task of the sensor device 102 is to determine the orientation of the magnet 101.

The orientation can be uniquely defined for example by means of two angles $\varphi$ and $\psi$, where $\varphi$ is a negative or positive angle with respect to the Z-axis of an orthogonal projection of the axis A in the YZ-plane, and w is a negative or positive angle with respect to the Z-axis of an orthogonal projection of the axis A in the XZ-plane. In the example shown, if the axis A of the magnet is oriented perpendicular to the semiconductor substrate, the magnetic field vector B at the intersection of the axis A and the semiconductor substrate, is oriented in the negative Z-direction, $\varphi=0°$ and $\psi=0°$. The magnet is preferably movable at least in the range $\varphi$ from −30° to +30°, and the range $\psi$ from −30° to +30°, but of course larger ranges are also envisioned, e.g. ±40°, or ±50°, or ±60°. Specifying the orientation of the magnet 101 by means of the angles $\varphi$ and $\psi$ is, however, not the only possible way.

Figure 2:
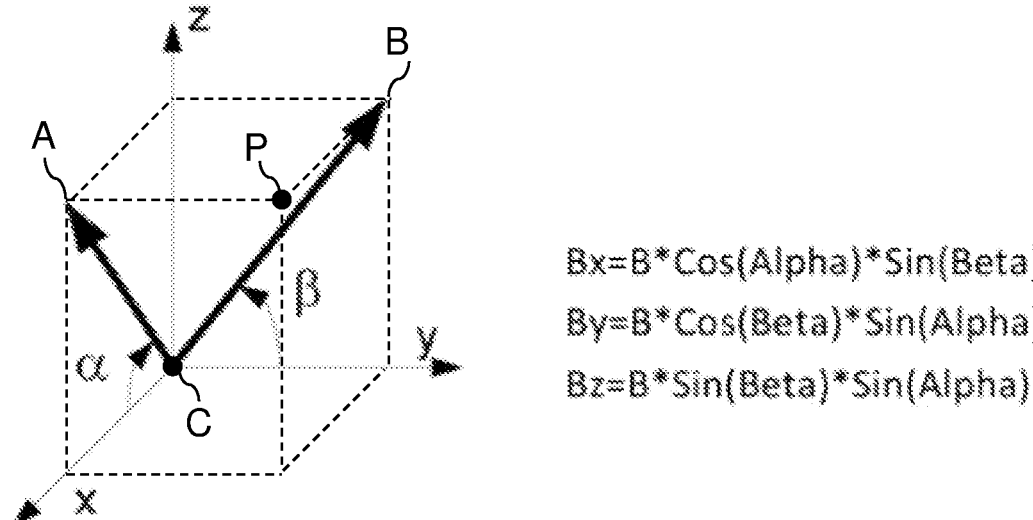
FIG. 2 shows how a random orientation of a line segment [CP] can be represented by two angles α and β.

FIG. 2 shows another way of defining the orientation of a vector of a constant length [CP] starting from the reference point "C" and ending at a point "P" on an imaginary sphere. The vector [CP] is not shown, but a first orthogonal projection [CA] of the vector [CP] onto the plane XZ is shown, and a second orthogonal projection [CB] of the vector [CP] onto the plane YZ is shown. The orientation of an axis A passing through the points C and P can also be defined by a first angle $\alpha$ between the positive X-axis and the vector [CA], and by a second angle $\beta$ between the positive Y-axis and the vector [CB]. As an example, if the magnet axis is oriented perpendicular to the plane XY (i.e. perpendicular to the semiconductor substrate), also referred to as the "neutral position", $\alpha=90°$ and $\beta=90°$. This corresponds to the orientation in which $\varphi=0°$ and $\psi=0°$, described above.

The following formulas apply:

$$Bx=B^*\cos(\alpha)^*\sin(\beta) \tag{1}$$

$$By=B^*\cos(\beta)^*\sin(\alpha) \tag{2}$$

$$Bz=B^*\sin(\beta)^*\sin(\alpha) \tag{2}$$

Division of [3] and [1] yields:

$$(Bz/Bx)=\tan(\alpha) \tag{4}$$

$$(Bz/By)=\tan(\beta) \tag{5}$$

where Bx is the magnetic field component oriented in the X-direction, By is the magnetic field component oriented in the Y-direction, Bz is the magnetic field component oriented in the Z-direction, and B is the magnitude of the magnetic field vector. Thus, by measuring Bx, By, Bz, at the reference point Pref, the angles $\alpha$ and $\beta$ can be calculated, but this solution is quite sensitive to external influences and/or ageing effect, e.g. to temperature variations, mounting tolerances, demagnetization of the magnet, an external disturbance field, etc.

In preferred embodiments, the angles $\alpha$ and $\beta$ are values in the range from $90°\pm30°$, or in the range from $90°\pm40°$, or in the range from $90°\pm50°$, or in the range from $90°\pm60°$.

Figure 3A:
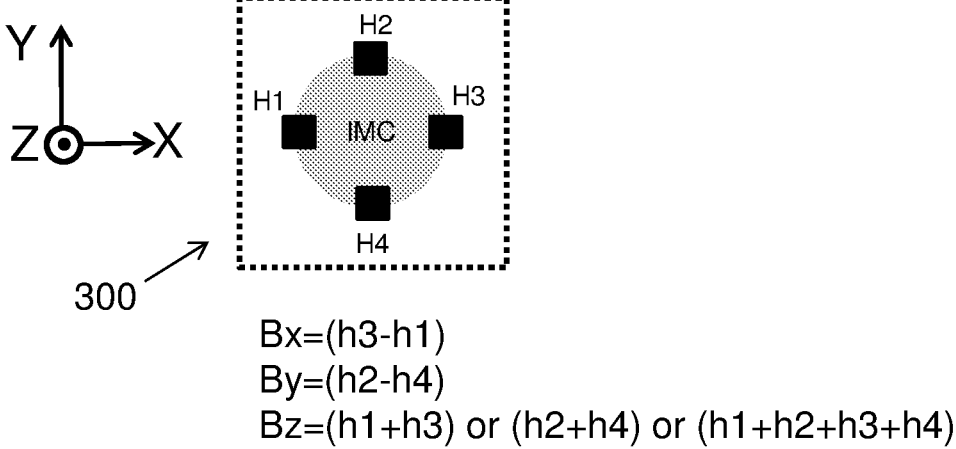
FIG. 3A is a schematic block-diagram of a sensor structure as may be used in embodiments of the present invention. The sensor structure comprises a disk shaped integrated magnetic concentrator (IMC) and four horizontal Hall elements situated at a periphery of the disk, angularly spaced by multiples of 90°. This sensor structure is capable of measuring 3 orthogonal magnetic field components and is also referred to as a "3D magnetic pixel".

FIG. 3A is a schematic block-diagram of a sensor structure 300 as may be used in embodiments of the present invention. The sensor structure comprises a disk shaped integrated magnetic concentrator IMC and four horizontal Hall elements H1 to H4 situated at a periphery of the disk, angularly spaced by multiples of 90°. This sensor structure is capable of measuring 3 orthogonal magnetic field components at the centre of the IMC disk and is also referred to as a "3D magnetic pixel". Formulas are provided to calculate the three orthogonal magnetic field components Bx, By, Bz from the sensor signals h1, h2, h3, h4 provided by the horizontal Hall elements H1, H2, H3, H4 respectively. It is noted that, in practice, the signals obtained from the Hall elements are amplified or scaled in known manners, but the scaling factor is omitted here to keep the explanation simple.

The IMC may have a disk shape with a diameter in the range from 150 μm to 250 μm, e.g. in the range from 170 μm to 230 μm, for example equal to about 200 μm.

Figure 3B:
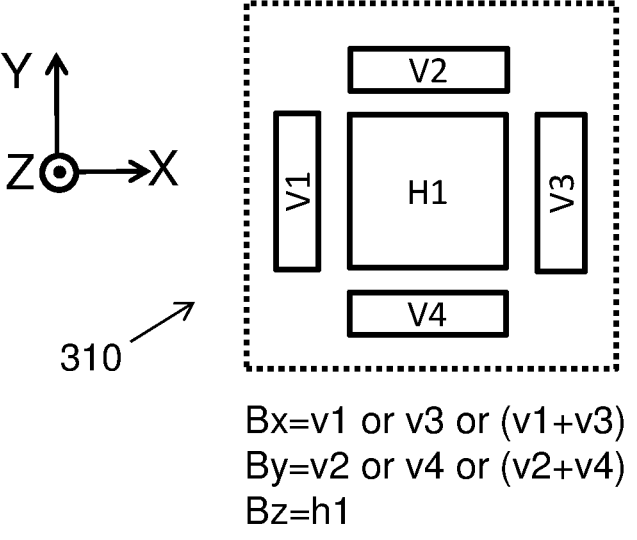
FIG. 3B is a schematic block-diagram of another sensor structure as may be used in embodiments of the present invention. This sensor structure comprises a horizontal Hall element and four vertical Hall elements, arranged near the periphery of the horizontal Hall element. This sensor structure is also capable of measuring 3 orthogonal magnetic field components and is therefore also a "3D magnetic pixel".

FIG. 3B is a schematic block-diagram of another sensor structure 310 as may be used in embodiments of the present invention. This sensor structure comprises a horizontal Hall element H1 and four vertical Hall elements V1 to V4, arranged near the periphery of the horizontal Hall element. This sensor structure is also capable of measuring 3 orthogonal magnetic field components Bx, By, Bz at the centre of H1, and is therefore also referred to as a "3D magnetic pixel". Formulas are provided to calculate the three orthogonal magnetic field components Bx, By, Bz from the sensor signals h1, v1, v2, v3, v4 provided by the horizontal Hall element H1 and the vertical Hall elements V1, V2, V3, V4 respectively. It is noted that, in practice, the signals obtained from the Hall elements are amplified or scaled in known manners, but the scaling factor is omitted here to keep the explanation simple.

It is noted that it is not absolute required to use four vertical Hall elements in order to measure Bx and By, but more accurate results may be obtained by summing or averaging the signals (v1 and v3) to calculate Bx, and by summing or averaging the signals (v2 and v4) to calculate By.

FIG. 4(a) to FIG. 4(d) are schematic representations of a cylindrical magnet 401 having an axis A that intersects a semiconductor substrate 403a, 403b at a predefined reference position Pref.

Figures 4A, 4B, 4C, 4D:
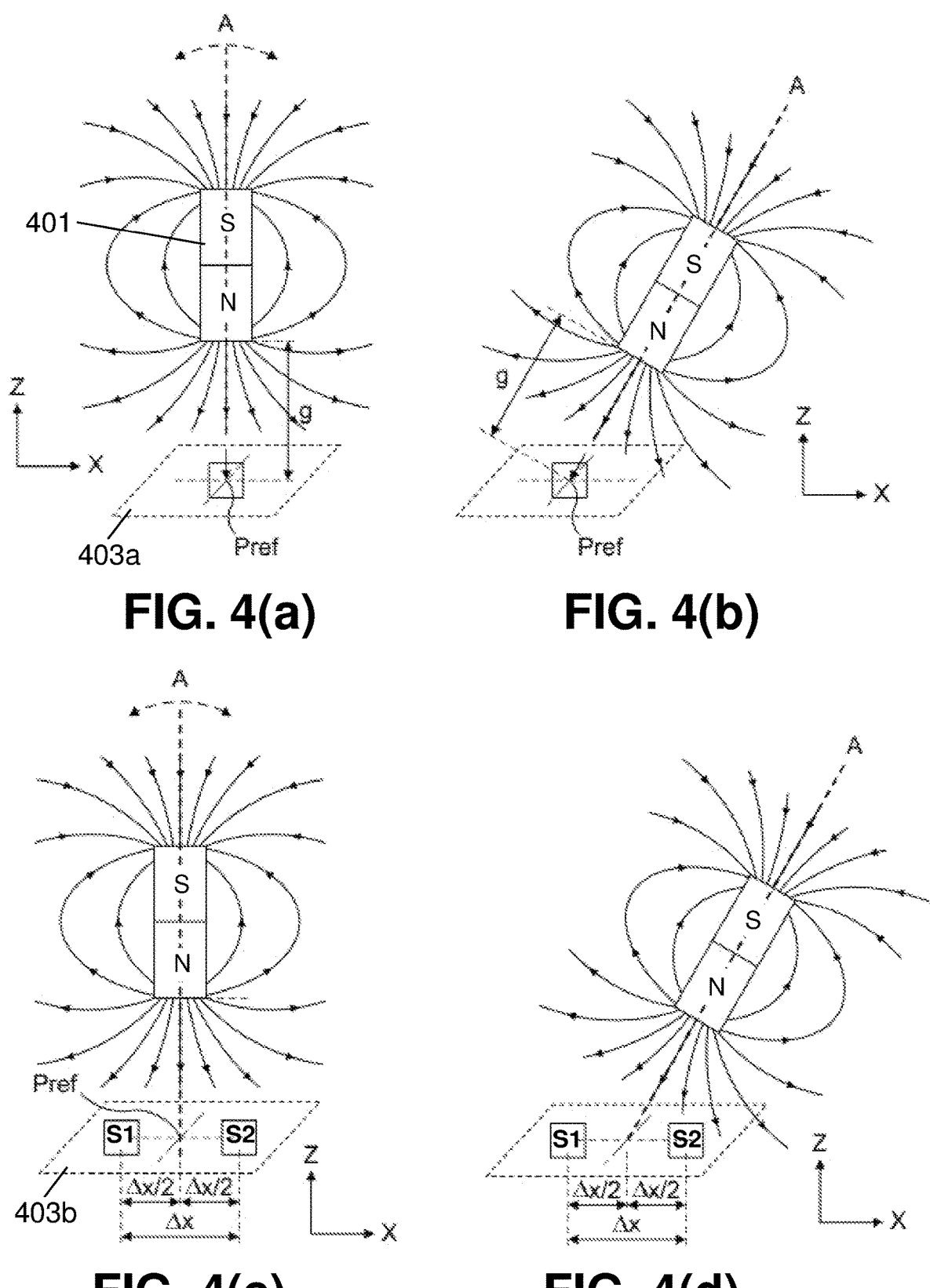
FIG. 4(*a*) to FIG. 4(*d*) are schematic representations of a cylindrical magnet having an axis that intersects a semiconductor substrate at a predefined reference position.

In FIG. 4(a) and FIG. 4(b) a sensor or sensor structure (schematically indicated by a square) is situated at said reference position. As can be seen, the magnetic field line passing through the sensor location has the same orientation as the mechanical angle of the axis A, and the distance between the sensor and the magnet is independent of the orientation of the axis.

In FIG. 4(c) and FIG. 4(d) the semiconductor substrate 403b contains a plurality of sensors or sensor structures (schematically indicated by two squares) situated at sensor positions S1, S2 which are spaced from the reference position Pref. As can be seen, the orientation of the magnetic field lines at the plurality of sensor locations is not the same as the orientation of the axis A, and the distance between each of the sensor locations and the magnet is not constant but is dependent of the orientation of the axis.

Figure 5A:
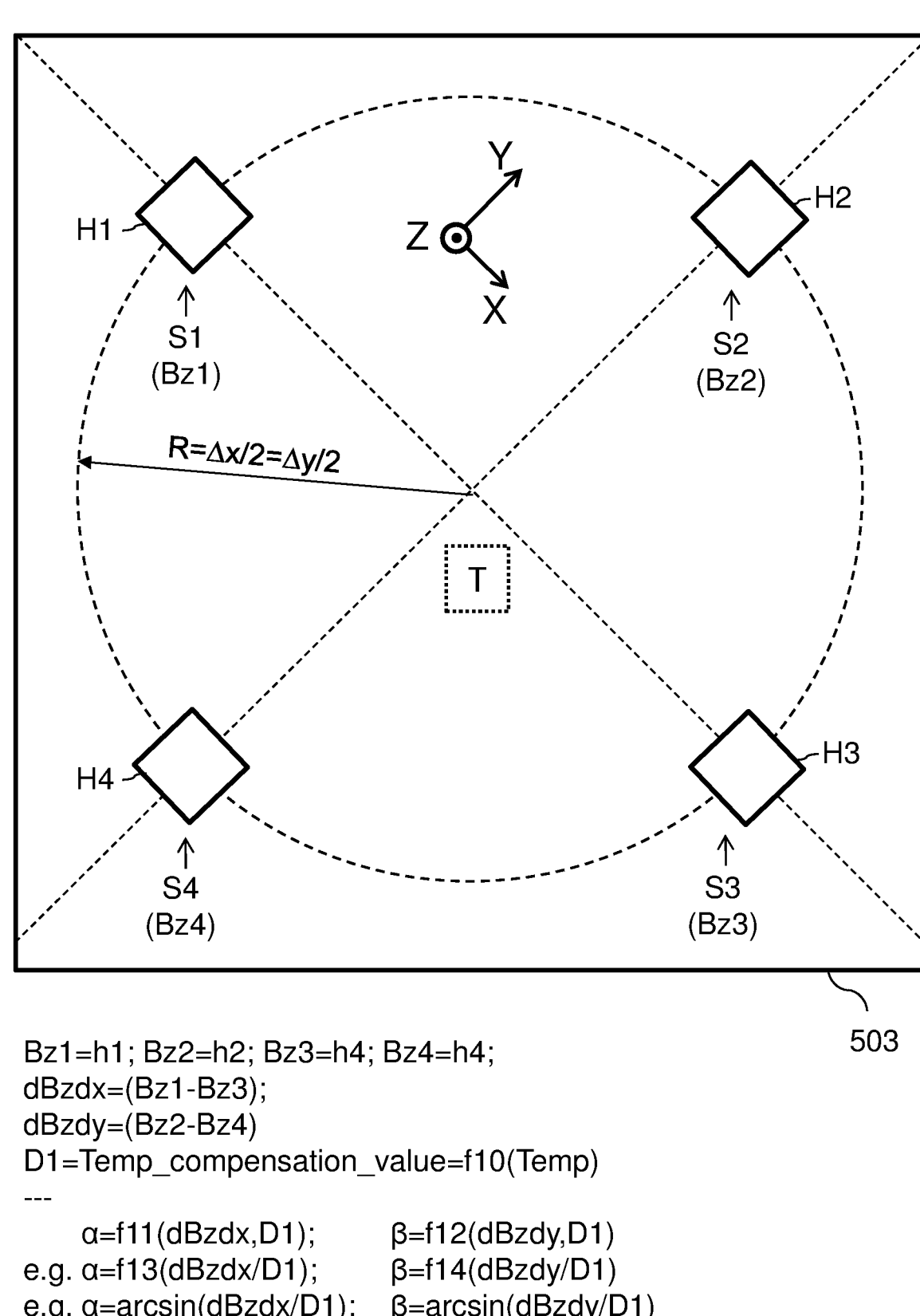
FIG. 5A is a schematic representation of a sensor arrangement as can be used in embodiments of the present invention, e.g. in the sensor device of FIG. 1, and a set of formulas for determining the orientation of the magnet using a correction value D1 being a predefined function of temperature.

FIG. 5A is a schematic representation of a sensor arrangement as can be used in embodiments of the present invention, e.g. in the sensor device 102 of FIG. 1. This sensor arrangement may be implemented on a semiconductor substrate 503, e.g. a silicon substrate.

The sensor arrangement contains four magnetic sensors S1 to S4 arranged on a virtual circle and spaced apart by multiples of 90°. Each sensor is capable of measuring a magnetic field component Bz oriented in a direction Z perpendicular to the semiconductor substrate 503. The sensor S1 may comprise a horizontal Hall element H1 capable of measuring Bz1 at a first sensor location, the second sensor S2 may comprise a horizontal Hall element H2 capable of measuring Bz2 at a second sensor location, the third sensor S3 may comprise a horizontal Hall element H3 capable of measuring Bz3, and the fourth sensor S4 may comprise a horizontal Hall element H4 capable of measuring Bz4.

The sensors S1 and S3 are located opposite each other on the virtual circle, and are spaced apart by a distance $\Delta x$ along a first direction X. A magnetic field difference $\Delta Bz13$ can be calculated as a difference between Bz1 and Bz3. A magnetic field gradient dBz/dx can be calculated as $\Delta Bz13/\Delta x$, but the division by $\Delta x$ is often omitted, because the sensor signals need to be scaled anyway, and the distance $\Delta x$ can be taken into account in the scaling factor, as is well known in the art. For this reason, in this document, the magnetic field difference $\Delta Bz13$ and the magnetic field gradient dBz/dx are considered equivalent notations, as well as the notation dBzdx. The latter notation is preferred, because it indicates the direction in which the magnetic field component is oriented (z), and it indicates the direction along which the difference or gradient is determined (x) and avoids the impression that a division by $\Delta x$ is required.

Likewise, the sensors S2 and S4 are located on a Y-axis, which is perpendicular to the X-axis, and are spaced apart by a predefined distance $\Delta y$. A magnetic field gradient dBz/dy can be calculated as a difference between Bz2 and Bz4, but this value can also be written as $\Delta Bz24$ or as dBzdy.

The orientation of the magnet (not shown in FIG. 5A, but see e.g. FIG. 1 or FIG. 16 to FIG. 18) can be determined by means of a first angle $\alpha$ and a second angle $\beta$. In the embodiment of FIG. 5A.

The first angle $\alpha$ is calculated as a function f11 of the magnetic field gradient dBzdx and a first correction value D1, e.g. as a function f13 of a ratio of said magnetic field gradient dBzdx and said first correction value D1, e.g. as an arctangent function of said ratio, optionally followed by a non-linearity correction. This may e.g. be implemented using a look-up table, optionally with linear interpolation;

and the second angle $\beta$ is calculated as a function f12 of the magnetic field gradient dBzdy and said correction value D1, e.g. as a function f14 of a ratio of said magnetic field gradient dBzdy and said first correction value D1, e.g. as an arctangent function of said ratio, optionally followed by a non-linearity correction. This may e.g. be implemented using a look-up table, optionally with linear interpolation;

wherein the correction value D1 is a function f10 of a temperature of the magnet (or an estimate of that temperature) chosen such that f10(Temp) is indicative of the magnetic field strength of the magnet but is substantially independent of temperature.

The temperature of the magnet may be measured using a temperature sensor (e.g. a thermocouple, or a thermistor, or a temperature dependent resistor) mounted to the magnet and electrically connected to the sensor device, or may be estimated using a temperature sensor "T" incorporated in the sensor device 503, e.g. embedded in the semiconductor substrate.

Figure 5B:
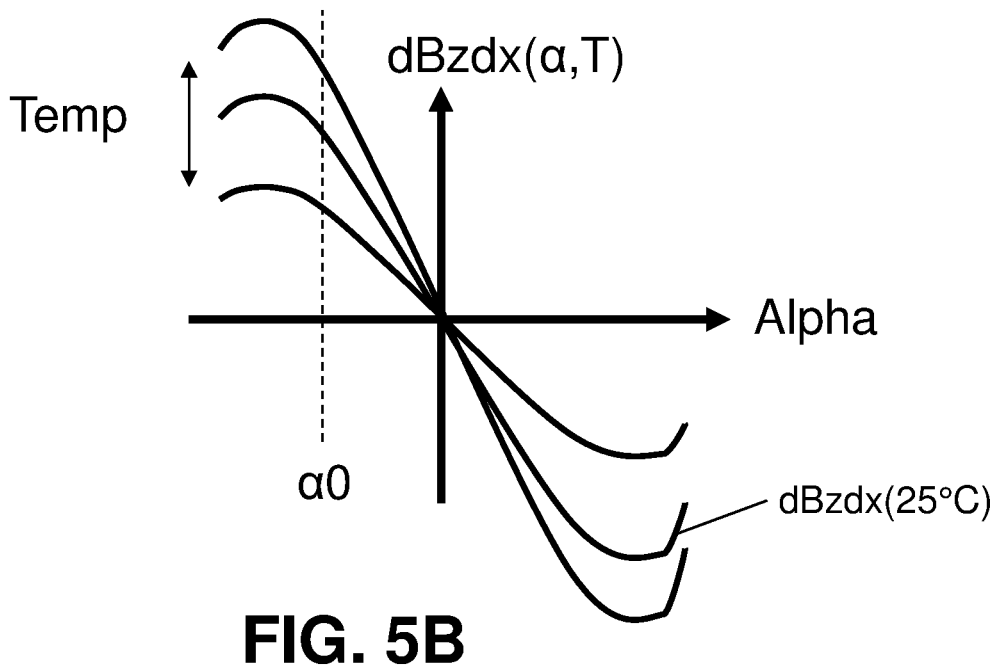
FIG. 5B is a graph showing an illustrative example of how the magnetic field gradient dBzdx may vary as a function of angular excursion, and as a function of temperature.

FIG. 5B is a graph showing an illustrative example of how the magnetic field gradient dBz/dx typically varies as a function of the angle alpha, and as a function of temperature of the magnet.

The function dBzdx($\alpha$,T) can be written as, or approximated by, a product of a constant (indicative of the field strength of the particular magnet) and a first function dBzdx (angle) which is only dependent on the angle, and a second function dBzdx(T) which is only dependent on temperature.

While not explicitly shown, the magnetic field gradient dBz/dy will vary in a similar manner as a function of the angle beta and temperature.

Figure 5C:
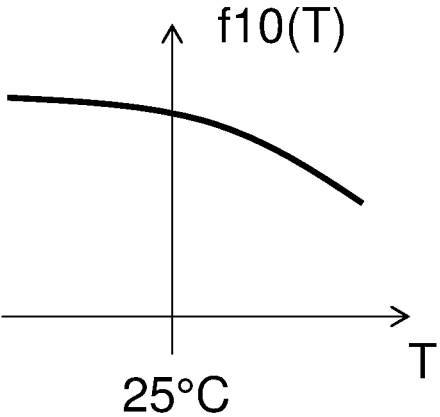
FIG. 5C shows an illustrative example of a temperature dependent correction factor as can be used in embodiments of the present invention.

FIG. 5C is a graph showing an illustrative example of such a second function, referred to herein as f10(T). This function shows how the magnetic strength of the magnet varies with temperature. This function is dependent on the material of the magnet. The value at a predefined temperature (e.g. 25° C.) can be considered as a reference value. The function f10(T) can be determined during design, or can be measured during a calibration test, and can be stored in a non-volatile memory of the sensor device during production, or during a calibration test, in any suitable form, e.g. in the form of a look-up table, or as a set of parameters of a parameterised curve, or as a set of coefficients of a polynomial expression. The same correction function f10(T) can be used when calculating the angle beta.

A sensor system 100 comprising a magnet 101 which is movably mounted as shown in FIG. 1 and comprising a sensor device 102 having a sensor structure as shown in FIG. 5A, and using the formulas as mentioned in FIG. 5A, is capable of determining the orientation of the magnet 101 in a highly accurate manner, in particular, in a manner which is highly insensitive to an external disturbance field, and which is highly insensitive to temperature variations.

Figure 6:
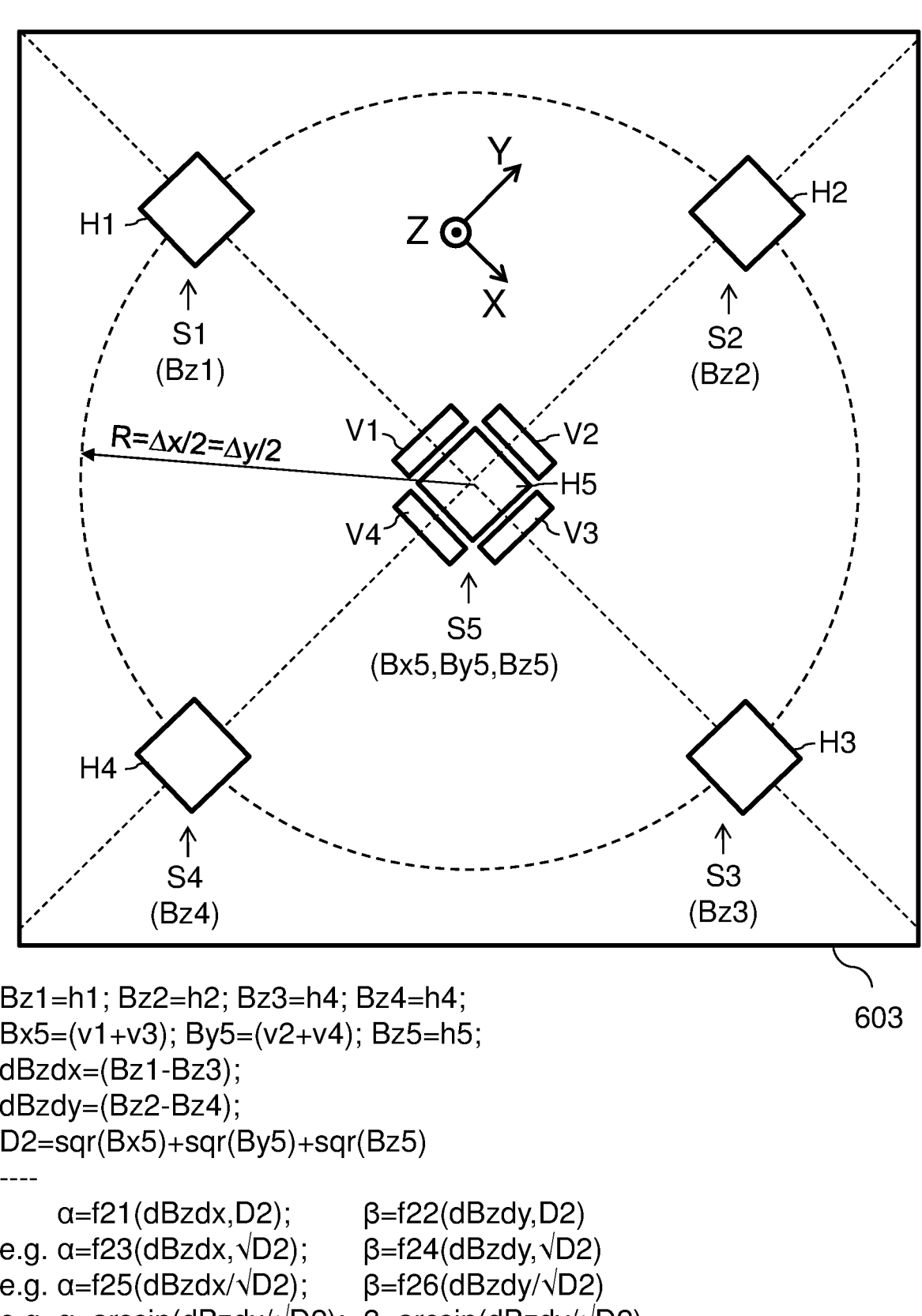
FIG. 6 and FIG. 7 show a schematic representation of another sensor arrangement as can be used in embodiments of the present invention, e.g. in the sensor device of FIG. 1, and a set of formulas for determining the orientation of the magnet using a correction value D2 being a sum of squares of three orthogonal magnetic field components.

FIG. 6 is a schematic representation of a sensor arrangement as can be used in embodiments of the present invention, e.g. in the sensor device 102 of FIG. 1. This sensor arrangement may be implemented on a semiconductor substrate 603, e.g. a silicon substrate.

The sensor arrangement of FIG. 6 can be seen as a variant of the sensor arrangement of FIG. 5, with the addition of a fifth sensor S5 situated in the centre of the virtual circle. The fifth sensor S5 is a 3D magnetic pixel and is capable of measuring three orthogonal magnetic field components Bx5, By5, Bz5. In the example of FIG. 6, the fifth sensor S5 comprises a horizontal Hall element H5 and two vertical Hall elements V1, V3 having an axis of maximum sensitivity oriented in the X-direction, and having two vertical Hall elements V2, V4 having an axis of maximum sensitivity oriented in the Y-direction.

In the embodiment of FIG. 6, a correction factor D2 is calculated as a sum of squares of the values Bx5, By5 and Bz5, in accordance with the formula D2=sqr(Bx5)+sqr (By5)+sqr(Bz5). The value of D2 is indicative of the strength of the magnetic field of the magnet. For a given magnet mounted in a sensor system as shown in FIG. 1A, the value of D2 varies with temperature in the same manner as shown in FIG. 5C, but in the embodiment shown in FIG. 6, the magnetic field strength D2, or a value derived therefrom, e.g. a square root of D2, is used as a correction factor.

A first magnetic field difference or magnetic field gradient dBzdx can be determined using signals h1, h3 obtained from the first and the third sensor S1, S3. A second magnetic field difference or magnetic field gradient dBzdy can be determined using signals h2, h4 obtained from the second and the fourth sensor S2, S4.

The first angle $\alpha$ can be determined as a function f21 of the first magnetic field gradient dBzdx and the correction value D2, e.g. as a function f23 of the first magnetic field gradient dBzdx and the square root of the correction value D2, e.g. as a function f25 of the ratio of the first magnetic field gradient dBzdx and the square root of the correction value D2, e.g. as an arcsine function of this ratio.

The second angle $\beta$ can be determined as a function f22 of the second magnetic field gradient dBzdy and the correction value D2, e.g. as a function f24 of the second magnetic field gradient dBzdy and the square root of the correction value D2, e.g. as a function f26 of the ratio of the second magnetic field gradient dBzdy and the square root of the correction value D2, e.g. as an arcsine function of this ratio. The value of $\sqrt{D2}$ is substantially proportional to the magnetic field strength but is somewhat sensitive to an external disturbance field.

A sensor system 100 comprising a magnet 101 which is movably mounted as shown in FIG. 1 and comprising a sensor device 102 having a sensor structure as shown in FIG. 6, and using the formulas as mentioned in FIG. 6, is capable of determining the orientation of the magnet 101 in a highly accurate manner, in particular, in a manner that has a reduced sensitivity to an external disturbance field, and which is highly insensitive to temperature variations. In additional, the sensor system is also highly insensitive to demagnetization of the magnet and to mounting tolerances, because, if the magnet gets weaker, and/or is located further away from the sensor device, both the nominator and the denominator will increase or decrease.

Figure 7:
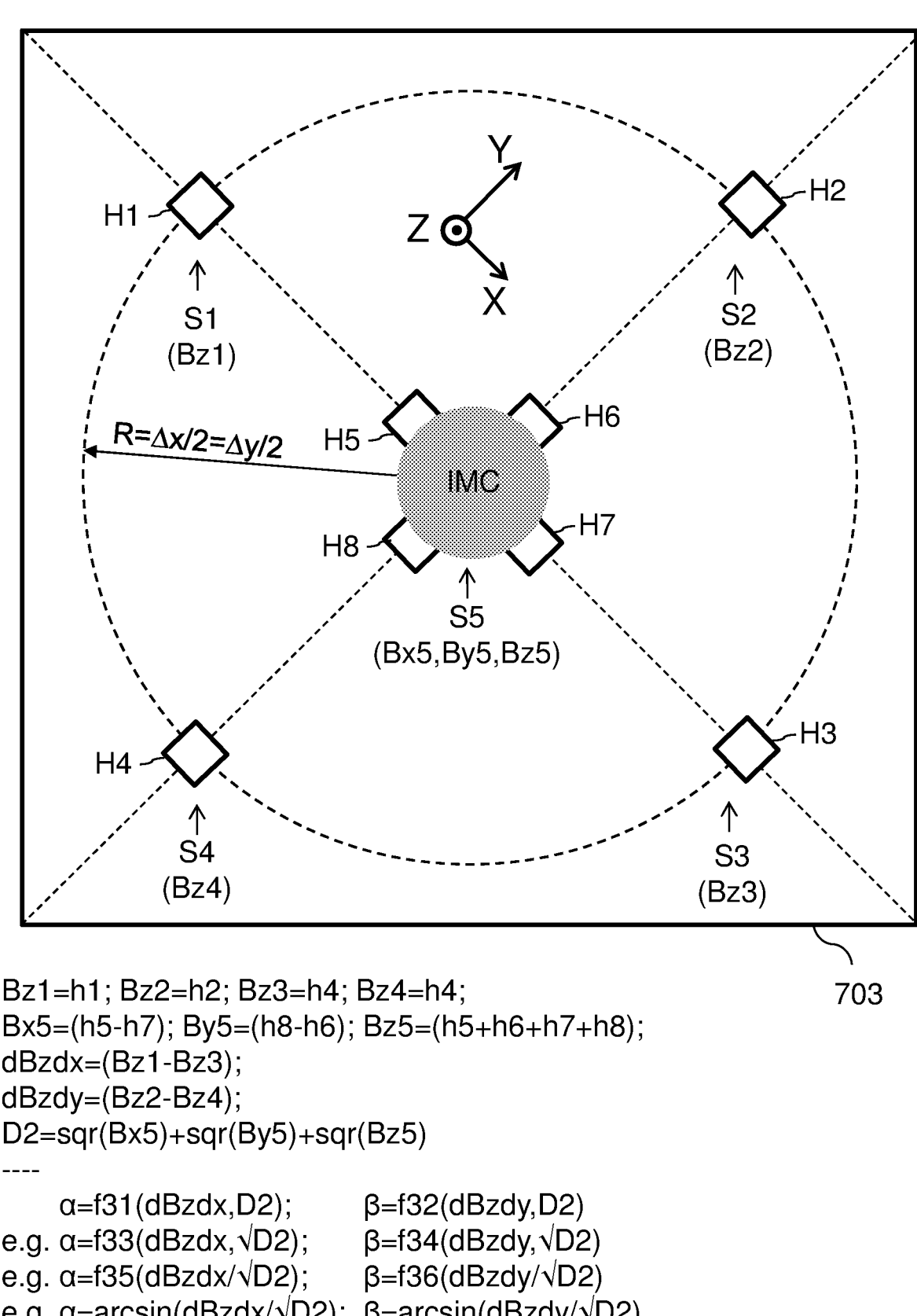

FIG. 7 is a schematic representation of another sensor arrangement as can be used in embodiments of the present invention. The sensor arrangement of FIG. 7 can be seen as a variant of the sensor arrangement of FIG. 6, wherein the fifth sensor S5 is also a 3D magnetic pixel capable of measuring three orthogonal magnetic field components Bx5, By5, Bz5, but comprises an integrated magnetic concentrator IMC and four horizontal Hall elements H5 to H8. Everything else described for the sensor arrangement of FIG. 6 is also applicable the sensor arrangement of FIG. 7, except that the magnetic field values Bx5, By5 and Bz5 are derived from the sensor signals h5 to h8 obtained from the horizontal Hall elements H5 to H8.

Figure 8:
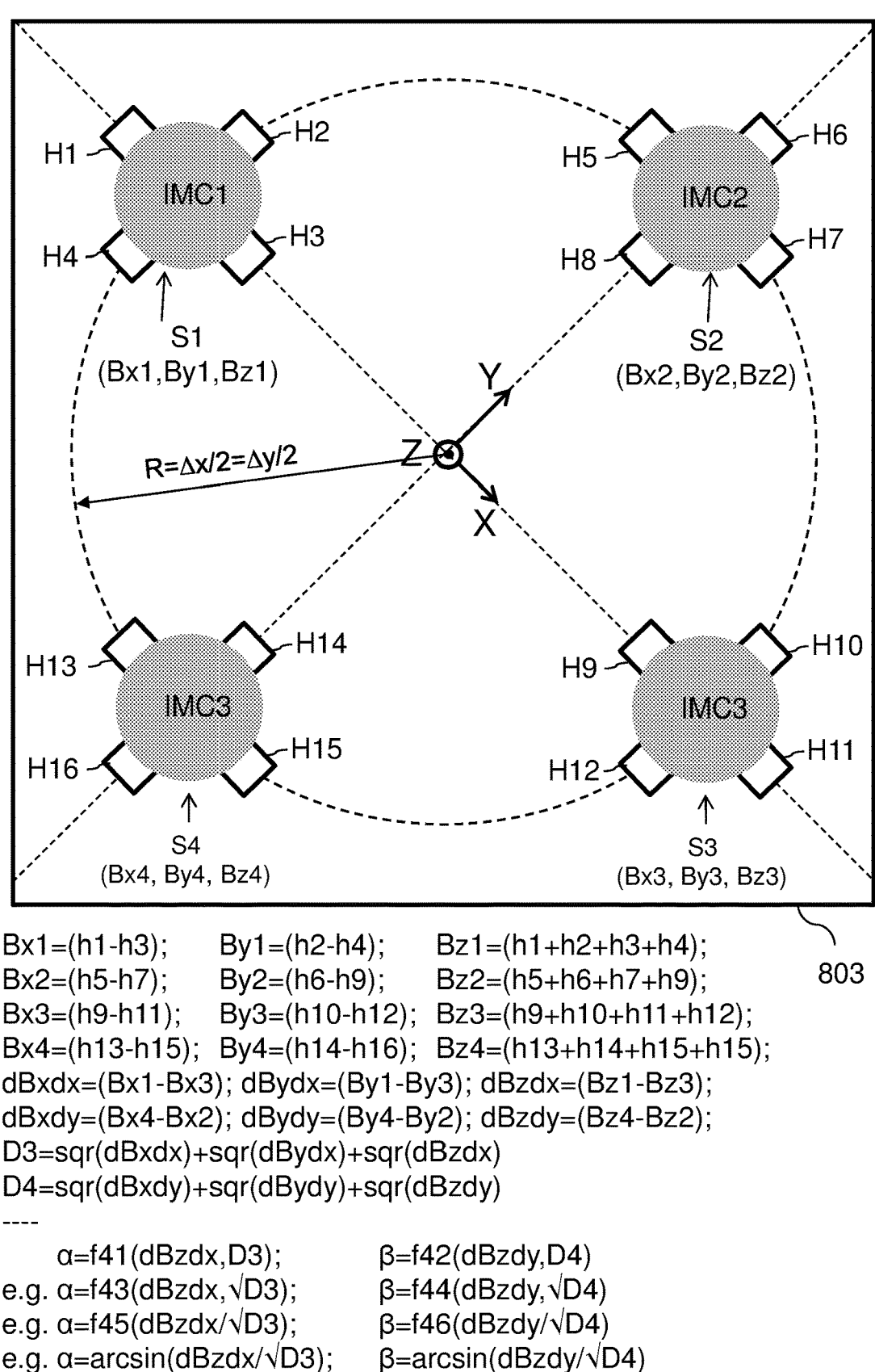
FIG. 8 and FIG. 10 show a schematic representation of another sensor arrangements as can be used in embodiments of the present invention, e.g. in the sensor device of FIG. 1, and a set of formulas for determining the orientation of the magnet using a correction value D3, D4 being a sum of squares of three orthogonal magnetic field gradients.

FIG. 8 is a schematic representation of another sensor arrangement as can be used in embodiments of the present invention, e.g. in the sensor device 102 of FIG. 1. This sensor arrangement may be implemented on a semiconductor substrate 803, e.g. a silicon substrate.

The sensor arrangement of FIG. 8 has four sensors S1 to S4 arranged on a virtual circle. Each of these sensors is a 3D magnetic pixel, capable of measuring three orthogonal magnetic field components at the respective sensor locations, for example, the first sensor S1 is capable of measuring three magnetic field components Bx1, By1, Bz1; the second sensor sensor S2 is capable of measuring three magnetic field components Bx2, By2, Bz2; the third sensor sensor S3 is capable of measuring three magnetic field components Bx3, By3, Bz3; and the fourth sensor sensor S4 is capable of measuring three magnetic field components Bx4, By4, Bz4.

Three magnetic field differences or gradients dBxdx, dBydx, dBzdx along the X-axis can be derived from the six magnetic field components measured by the first and third sensor S1, S3; and three magnetic field differences or gradients dBxdy, dBydy, dBzdy along the Y-axis can be derived from the six magnetic field components measured by the second and fourth sensor S2, S4.

A correction value D3 is calculated as a sum of squares of the three magnetic field differences or gradients dBxdx, dBydx, dBzdx along the X-axis, and a correction value D4 is calculated as a sum of squares of the three magnetic field differences or gradients dBxdy, dBydy, dBzdy along the Y-axis.

The first angle α can be determined as a function f41 of the first magnetic field gradient dBzdx and the correction value D3, e.g. as a function f43 of the first magnetic field gradient dBzdx and the square root of the correction value D3, e.g. as a function f45 of the ratio of the first magnetic field gradient dBzdx and the square root of the correction value D3, e.g. as an arcsine function of this ratio.

The second angle β can be determined as a function f42 of the second magnetic field gradient dBzdy and the correction value D4, e.g. as a function f44 of the second magnetic field gradient dBzdy and the square root of the correction value D4, e.g. as a function f46 of the ratio of the second magnetic field gradient dBzdy and the square root of the correction value D4, e.g. as an arcsine function of this ratio.

Figure 9:
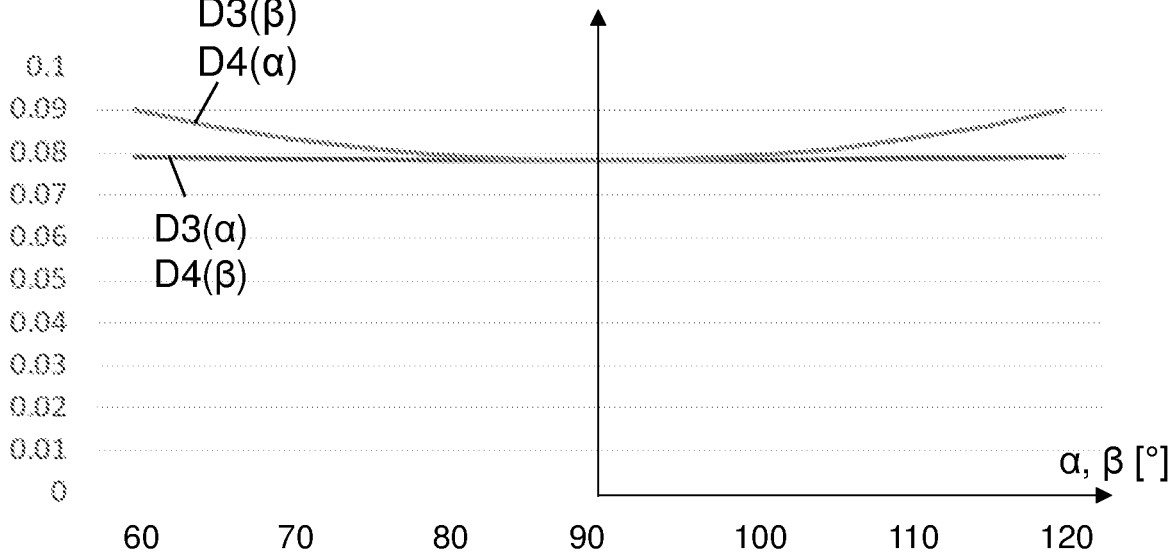
FIG. 9 shows these sum of squares as a function of angular displacement. in arbitrary units

FIG. 9 is a graph showing how the value of D3 and D4 varies as a function of the angle α and β, for excursions about the neutral position. Both values are substantially constant, (meaning: proportional to the magnetic field strength of the magnet), but it was surprisingly found that the curve D3 in the XZ plane and the curve D4 in the YZ plane have a slightly flatter course than the curve D3 in the YZ plane and the curve D4 in the XZ plane, which is why the correction value D3 is preferably used in combination with the first magnetic field gradient dBzdx and correction value D4 is preferably used in combination with the second magnetic field gradient dBzdy. The value of ID3 and ID4 is substantially proportional to the magnetic field strength, and is highly insensitive to an external disturbance field.

A sensor system 100 comprising a magnet 101 which is movably mounted as shown in FIG. 1 and comprising a sensor device 102 having a sensor structure as shown in FIG. 8, and using the formulas as mentioned in FIG. 8, is capable of determining the orientation of the magnet 101 in a highly accurate manner, in particular, in a manner which is highly insensitive to an external disturbance field, and which is highly insensitive to temperature variations, and which is highly insensitive to demagnetization of the magnet and to mounting tolerances.

Figure 10:
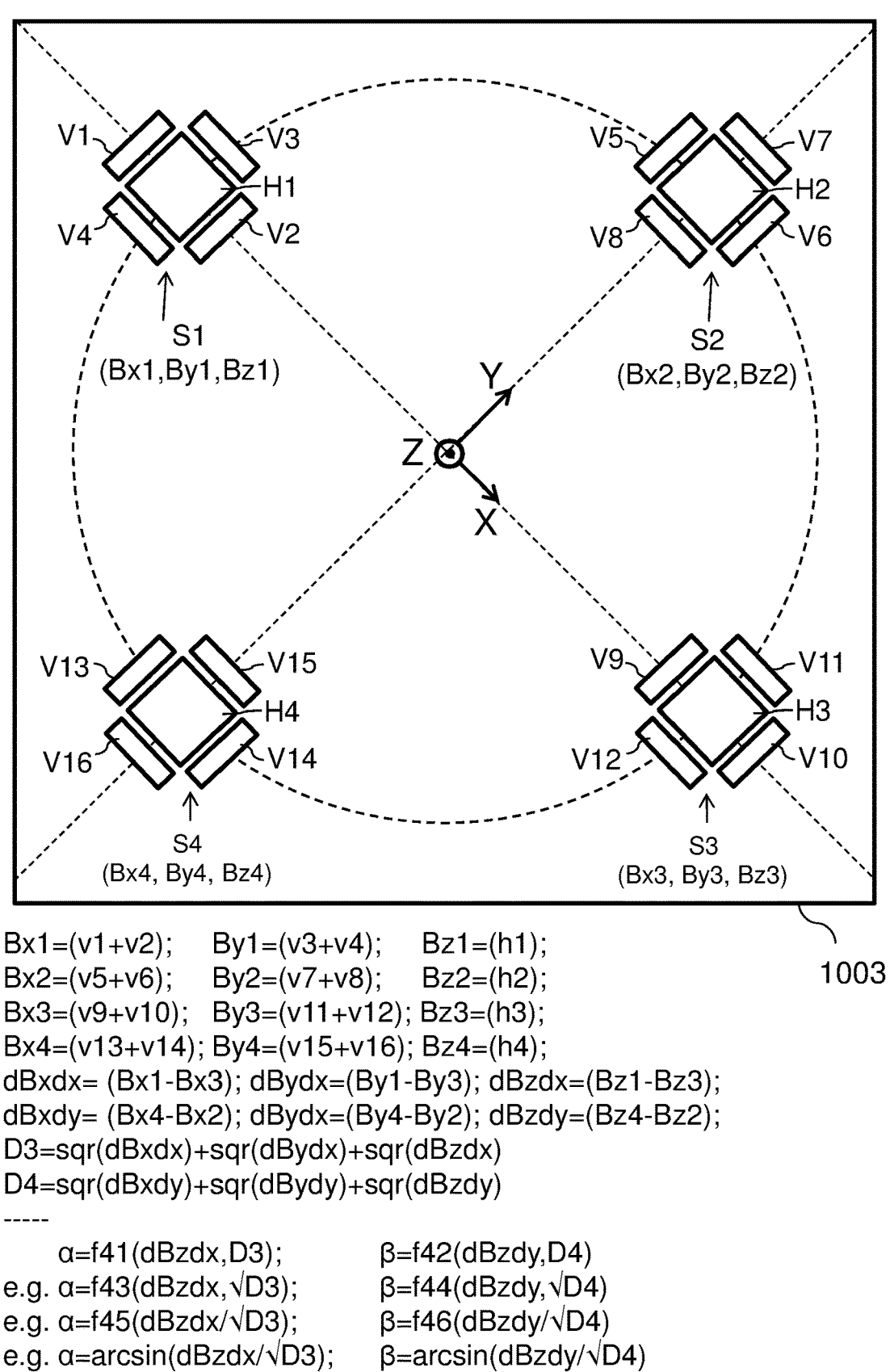

FIG. 10 is a schematic representation of another sensor arrangement as can be used in embodiments of the present invention. The sensor arrangement of FIG. 10 can be seen as a variant of the sensor arrangement of FIG. 8, wherein each of the four sensors S1 to S4 comprises a horizontal Hall element and four vertical Hall elements. Everything else described for the sensor arrangement of FIG. 8 is also applicable the sensor arrangement of FIG. 10, mutatis mutandis.

Figure 11:
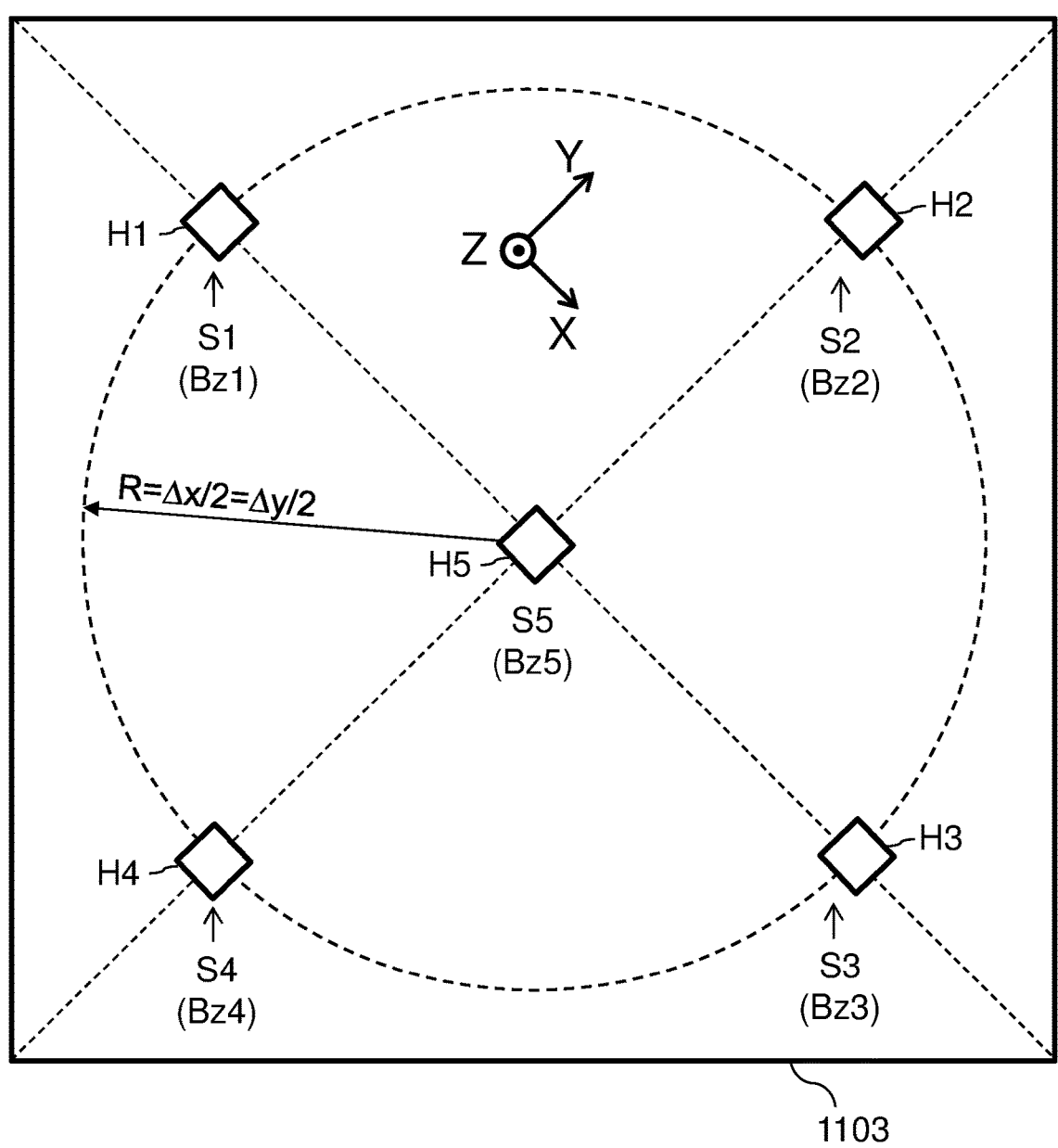
FIG. 11 shows a schematic representation of another sensor arrangements as can be used in embodiments of the present invention, e.g. in the sensor device of FIG. 1, and a set of formulas for determining the orientation of the magnet using a correction value D5, D6 being a second order gradient.

FIG. 11 is a schematic representation of another sensor arrangement as can be used in embodiments of the present invention, e.g. in the sensor device 102 of FIG. 1.

The sensor arrangement of FIG. 11 can be seen as a variant of the sensor arrangement of FIG. 5A with the addition of a fifth sensor S5 situated in the centre of the virtual circle, or as a variant of the sensor arrangement of FIG. 6 wherein the fifth sensor S5 is a 1D magnetic pixel. The fifth sensor S5 is a horizontal Hall element and is capable of measuring a magnetic field component Bz5.

In the embodiment of FIG. 11, a correction factor D5 is calculated as a linear combination of the signals obtained from three sensors S1, S5, S3 located on the X-axis, e.g. as (Bz1-2*Bz5+Bz3) indicative of a second order gradient of Bz along the X-axis. This value D5 can also be seen as a difference between two first-order gradients (Bz3−Bz5) and (Bz5−Bz1). And another correction factor D6 is calculated as a linear combination of the signals obtained from three sensors S2, S5, S4 located on the Y-axis, e.g. as (Bz4−2*Bz5+Bz2) indicative of a second order gradient of Bz along the Y-axis. This value D5 can also be seen as a difference between two first-order gradients (Bz2−Bz5) and (Bz5−Bz4). The value of D5 and D6 is substantially proportional to the magnetic field strength and is highly insensitive to an external disturbance field.

The first angle α can be determined as a function f51 of the first magnetic field gradient dBzdx and the correction value D5, e.g. as a function f53 of the ratio of the first magnetic field gradient dBzdx and the value D5, e.g. as an arctangent function of this ratio, optionally followed by a non-linearity correction. This may e.g. be implemented using a look-up table, optionally with linear interpolation.

The second angle β can be determined as a function f52 of the second magnetic field gradient dBzdy and the correction value D6, e.g. as a function f53 of the ratio of the first magnetic field gradient dBzdx and the value D5, e.g. as an arctangent function of this ratio, optionally followed by a non-linearity correction. This may e.g. be implemented using a look-up table, optionally with linear interpolation.

A sensor system 100 comprising a magnet 101 which is movably mounted as shown in FIG. 1 and comprising a sensor device 102 having a sensor structure as shown in FIG. 11, and using the formulas as mentioned in FIG. 1, is capable of determining the orientation of the magnet 101 in a highly accurate manner, in particular, in a manner that is highly insensitive to an external disturbance field, and to temperature variations, and to demagnetization of the magnet and to mounting tolerances.

Figure 12:
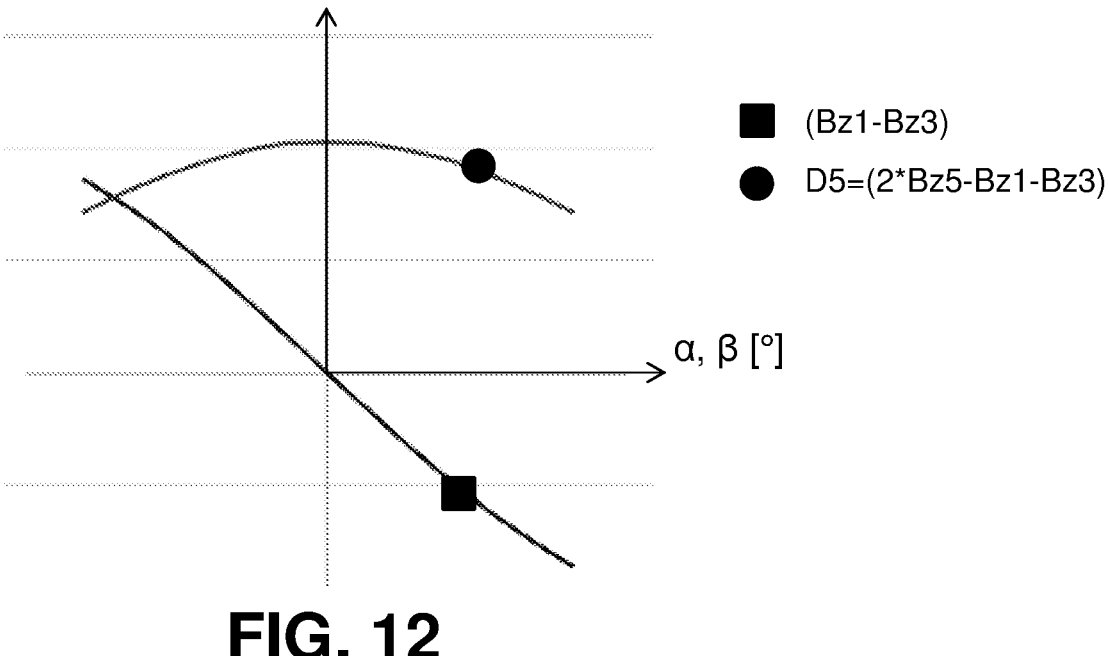
FIG. 12 shows an example of a graph with a first order gradient and a second order gradient as a function of angular displacement, as can be obtained by the sensor arrangement of FIG. 11.

FIG. 12 shows an example of a graph with arbitrary units, with a first curve (black square) corresponding to the order gradient dBzdx(α) as a function of angular displacement, and with a second curve (black circle) corresponding to a second order gradient as a function of angular displacement, as can be obtained by the sensor arrangement of FIG. 11. It is noted that the second order gradient of Bz along the X-axis can be calculated as (Bz3−Bz5)−(Bz5−Bz1), which is equal to (Bz3+Bz1−2*Bz5); and that the second order gradient of Bz along the Y-axis can be calculated as (Bz2−Bz5)−(Bz5−Bz4), which is equal to (Bz4+Bz2−2*Bz5).

Figure 13:
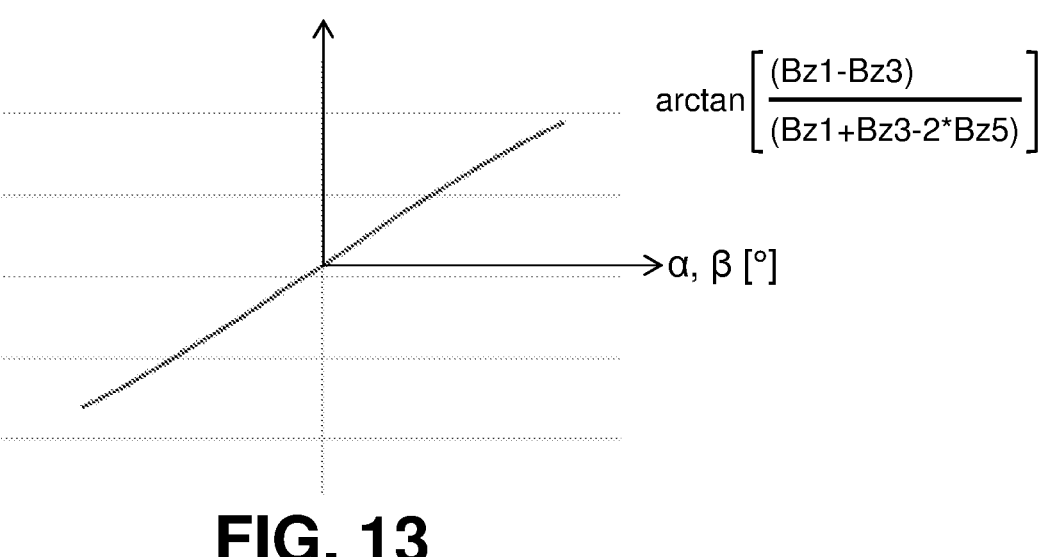
FIG. 13 shows a graph with the ratio of the first order gradient and the second order gradient of FIG. 12, as a function of angular displacement.

FIG. 13 shows the ratio of the first order gradient and the second order gradient of FIG. 12, as a function of angular displacement, in arbitrary units. As can be seen, this curve has a good linearity.

Figure 14:
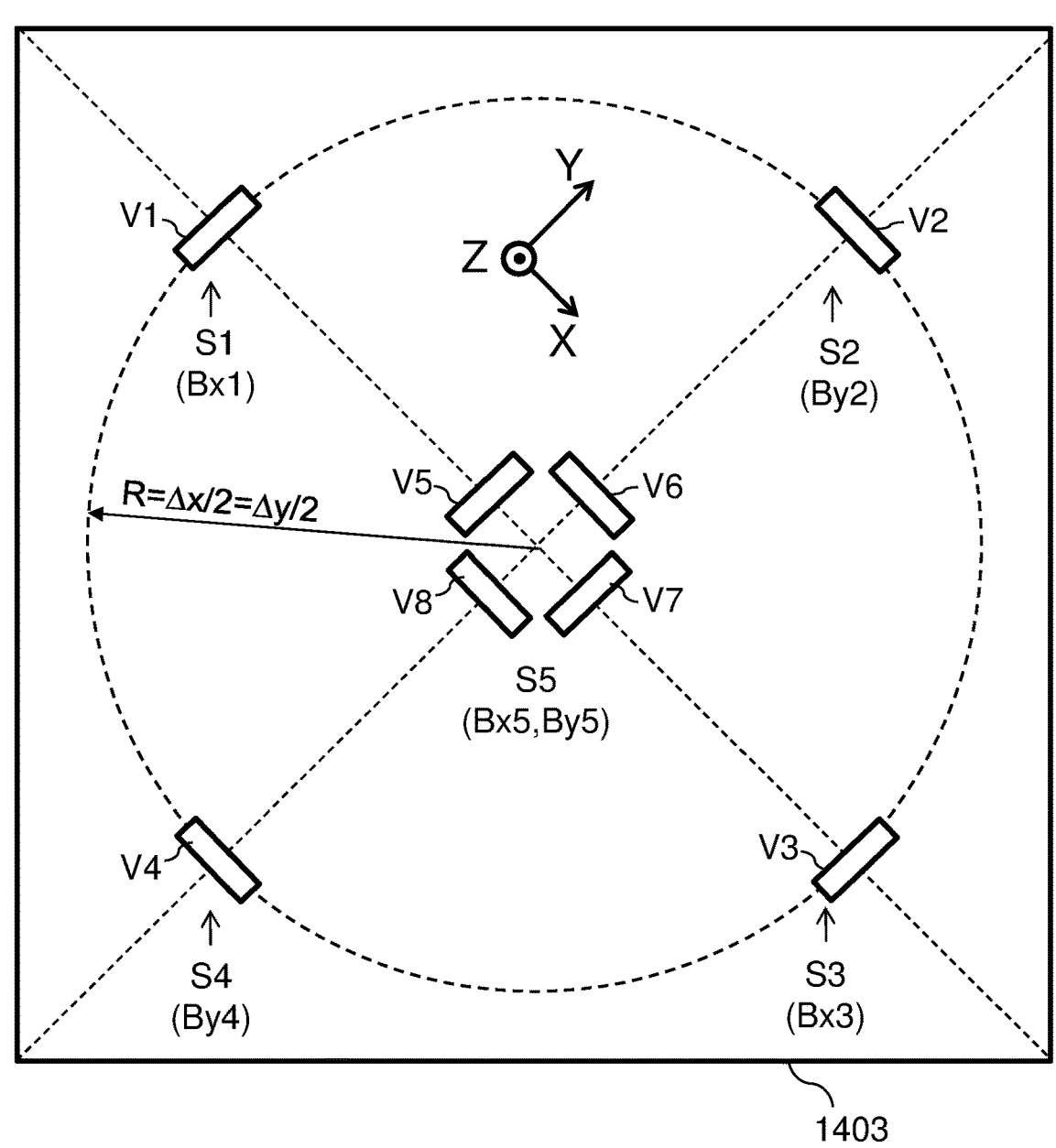
FIG. 14 shows a schematic representation of another sensor arrangements as can be used in embodiments of the present invention, e.g. in the sensor device of FIG. 1, and a set of formulas for determining the orientation of the magnet using a correction value D5, D6 being a second order gradient.

FIG. 14 is a schematic representation of another sensor arrangement as can be used in embodiments of the present invention. The sensor arrangement of FIG. 14 can be seen as a variant of the sensor arrangement of FIG. 11, wherein the sensors S1 and S3 are vertical Hall elements having an axis of maximum sensitivity oriented in the X-direction for measuring Bx1 and Bx3; and wherein the sensors S2 and S4 are vertical Hall elements having an axis of maximum sensitivity oriented in the Y-direction for measuring By2 and By4; and wherein the sensor S5 has at least one vertical Hall element V5, V7 with an axis of maximum sensitivity oriented in the X-direction for measuring Bx5; and has at least one vertical Hall element V6, V8 with an axis of maximum sensitivity oriented in the Y-direction for measuring By5.

A first gradient dBxdx of the magnetic field component Bx along the X-axis can be calculated based on the signals Bx1 and Bx3. A second gradient dBydy of the magnetic field component By along the Y-axis can be calculated based on the signals By2 and By4.

A correction factor D7 can be calculated as a linear combination of the signals obtained from three sensors S1, S5, S3 located on the X-axis, e.g. as (Bx1−2*Bx5+Bx3) indicative of a second order gradient of Bx along the X-axis. This value D7 can also be seen as a difference between two first-order gradients (Bx3−Bx5) and (Bx5−Bx1). And another correction factor D8 can be calculated as a linear combination of the signals obtained from three sensors S2, S5, S4 located on the Y-axis, e.g. as (By4−2*By5+By2) indicative of a second order gradient of By along the Y-axis. This value D8 can also be seen as a difference between two first-order gradients (By2−By5) and (By5−By4). The value of D7 and D8 is substantially proportional to the magnetic field strength and is highly insensitive to an external disturbance field.

The first angle α can be determined as a function f91 of the magnetic field gradient dBxdx and the correction value D7, e.g. as a function f93 of the ratio of the magnetic field gradient dxzdx and the value D7, e.g. as an arctangent function of this ratio.

The second angle β can be determined as a function f92 of the magnetic field gradient dBydy and the correction value D8, e.g. as a function f93 of the ratio of the magnetic field gradient dBydy and the value D8, e.g. as an arctangent function of this ratio.

A graph showing the magnetic field gradients dBxdx, dBydy and the second order gradients d2Bxdx2, d2Bydy2 will look a lot like FIG. 12, and their ratio will look a lot like FIG. 13.

A sensor system 100 comprising a magnet 101 which is movably mounted as shown in FIG. 1 and comprising a sensor device 102 having a sensor structure as shown in FIG. 14, and using the formulas as mentioned in FIG. 1, is capable of determining the orientation of the magnet 101 in a highly accurate manner, in particular, in a manner that is highly insensitive to an external disturbance field, and to temperature variations, and to demagnetization of the magnet and to mounting tolerances.

In all embodiments shown above, the first angle α and the second angle β are calculated individually, and independent of each other. In certain embodiments, it is possible to consider the so calculated values to be a first estimate of the orientation, and to perform a correction as a post-processing step, e.g. using a two-dimensional look-up table, optionally with interpolation. The values of this look-up table may be determined during a calibration procedure and may be stored in a non-volatile memory of the sensor device.

In the embodiments shown above, only horizontal Hall elements and vertical Hall elements are shown, but it is of course also possible to use other magnetic sensor structures, if they are capable of measuring the same magnetic field components, e.g. magnetoresistive (MR) sensors.

Figure 15:
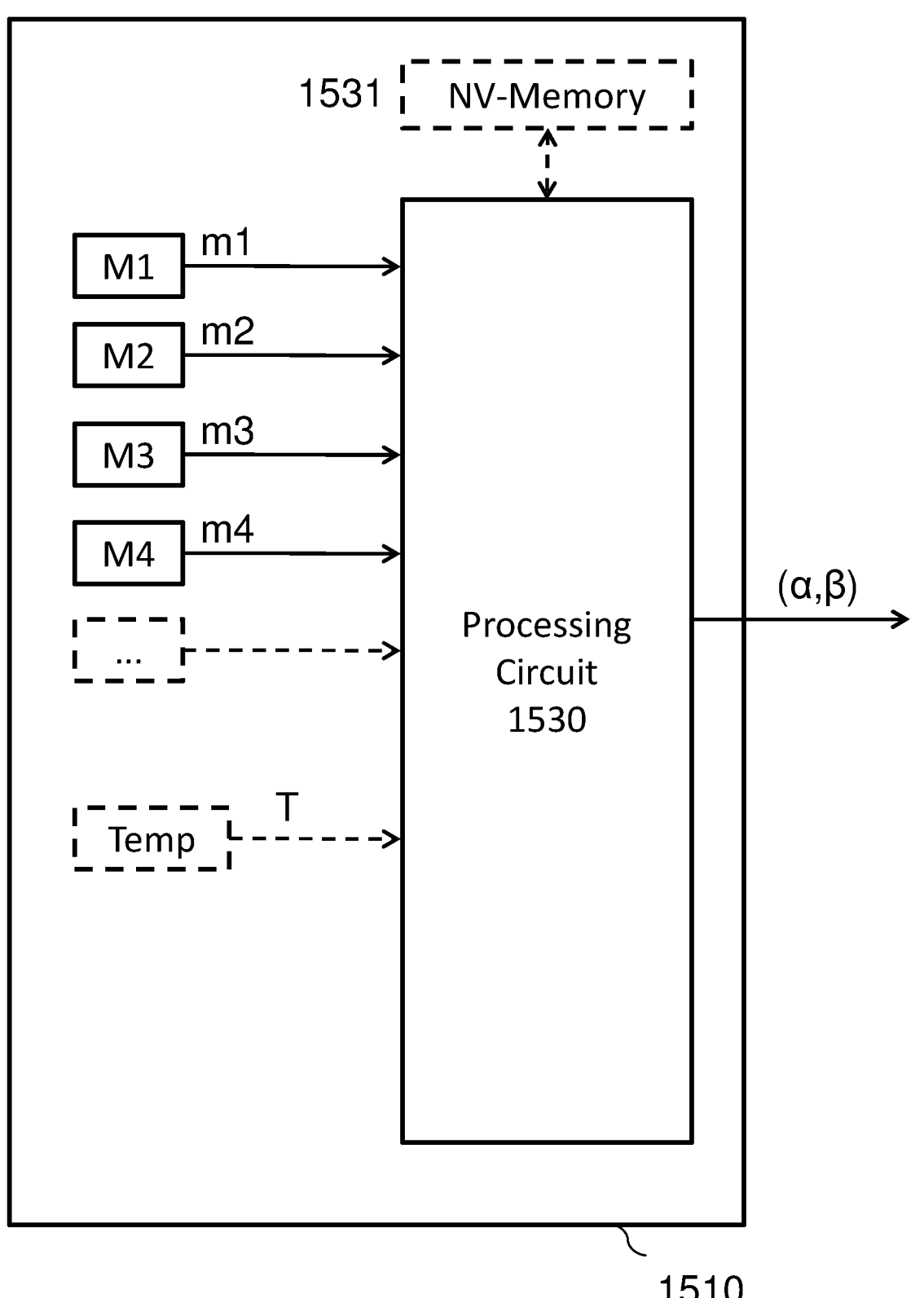
FIG. 15 shows an electrical block-diagram of a circuit that may be used in position sensor devices proposed by the present invention.

FIG. 15 shows an electrical block-diagram of a circuit 1510 that may be used in position sensor devices described above, e.g. in the device 102 of FIG. 1.

The circuit 1510 comprises a plurality of magnetic sensor elements M1 to M4 (e.g. horizontal Hall elements, vertical Hall elements, MR elements, etc.), and a processing unit 1530 (e.g. comprising analog components and/or digital components), and a non-volatile memory 1531 (e.g. eeprom or flash).

The plurality of magnetic sensor elements M1, M2, etc. may be part of a sensor arrangement as shown in FIG. 5A, FIG. 6, FIG. 7, FIG. 8, FIG. 10, FIG. 11 or FIG. 14. The biasing and readout of Hall sensors, or of circuits comprising MR elements is well known in the art, and hence need not be explained in further detail here.

A first angle α and a second angle β can be determined in manners described above, for example by using the mathematical formulas described above and/or illustrated in the Figures, and/or by using a look-up table, optionally with interpolation. Optionally a post-correction step is also applied.

The subtraction of signals for determining magnetic field components (e.g. h5-h7 of FIG. 7) and/or for determining magnetic field gradients (e.g. Bz1-Bz3 in FIG. 5A) may be performed in the analog domain before or after amplification, or in the digital domain.

The processing unit 1530 may comprise a digital processor, which may optionally comprise or be connected to a non-volatile memory 1531 (e.g. NVRAM or EEPROM or FLASH). This memory may comprise one or more constants, lookup-tables, coefficients of a polynomial, etc. The digital processor 1530 may for example be an 8-bit processor, or a 16-bit processor.

While not explicitly shown, the sensor device 1510 may further comprise one or more components or sub-circuits selected from the group consisting of: an amplifier, a differential amplifier, an analog-to-digital convertor (ADC), a multiplexer, etc. The ADC may have a resolution of at least 8 bits, or at least 10 bits, or at least 12 bits, or at least 14 bits, or at least 16 bits.

It is a major advantage that the processing circuit does not have to perform a Fast Fourier Transform (FFT) or has to implement a neural network with hundreds of nodes.

FIG. 16 and FIG. 17 show two specific examples of a sensor system like the one shown in FIG. 1. In the system 1600 of FIG. 16, the magnet is a cylindrical magnet having a diameter 'D' of about 4 mm, and a height 'H' of about 4 mm, and the magnet is situated at a distance 'g' of about 3 mm from the sensor device. In the system 1700 of FIG. 17, the magnet is a cylindrical magnet having a diameter 'D' of about 8 mm, and a height 'H' of about 4 mm, and the magnet is situated at a distance 'g' of about 3 mm from the sensor device. But of course, these are only two examples, and the present invention is not limited hereto.

FIG. 18 shows a variant of the sensor system of FIG. 1, where the magnet 1801 is pivotable about a reference point "Pref" which is situated at a predefined non-zero distance "dref" above a semiconductor substrate (not explicitly shown, but also defined by the XY-plane). In this example, the reference point "Pref" is located on the positive Z-axis, meaning that the magnet and the reference point are located on the same side of the substrate. But the present invention is not limited hereto, and the reference point may also be located on the negative Z-axis, i.e. on the opposite side of the substrate as the magnet.

The reference points "Pref" of the system shown in FIG. 1 and in FIG. 11 are situated outside of the space defined by the size of the cylindrical magnet and are located between the semiconductor substrate and the magnet, when the latter is in its neutral position (meaning, when ψ=0° and φ=0°.

But the present invention is not limited thereto, and the present invention will also work if the (real or imaginary) reference point "Pref" about which the axis of the magnet is pivotable, is situated inside the space defined by the magnet, or above the space defined by the magnet.

It was found that the same formulas as described above for calculating α and β may also be used in these cases. Optionally the sensor device may be further adapted for applying a post-processing on these angles, in manners known per se in the art, e.g. by applying a first piecewise-linear correction for the angle α, using a first set of pre-defined coefficients, and by applying a second piecewise-linear correction for the angle β, using a second set of predefined coefficients. These coefficients may be determined during a calibration step, and may be stored in a non-volatile memory of the sensor device. In another embodiment, the post-processing step may be based on a two-dimensional look-up table, with two-dimensional interpolation.

FIG. 19 shows a flow chart of a method 1900 for determining an orientation (α,β) of a cylindrical magnet having an axis (A) relative to a reference point "Pref" situated on a semiconductor substrate, the method comprising:

a) providing in step 1901 a silicon substrate comprising a plurality of magnetic sensors, and measuring a plurality of magnetic field components at a plurality of sensor locations;

b) determining in step 1902 a first magnetic field gradient (dBx/dx or dBz/dx) of a first magnetic field component (Bx or Bz) oriented in a first direction (X) parallel to the semiconductor substrate or oriented in a third direction (Z) perpendicular to said substrate, along said first direction (X);

c) determining in step 1903 a second magnetic field gradient (dBy/dy or dBz/dy) of a second magnetic field component (By or Bz) oriented in a second direction (Y) parallel to the semiconductor substrate and perpendicular to the first direction (X) or oriented in the third direction (Z) perpendicular to said substrate, along said second direction (Y);

d) determining in step 1904 a first angle α formed between an orthogonal projection of the axis "A" of the magnet on a first virtual plane XZ parallel to the first direction X and the third direction Z, as a function of said first magnetic field gradient (dBx/dx or dBz/dx) and a first correction value (D1, D2, D3, D5, D7) related to a magnetic field strength of the magnet;

e) determining in step 1905 a second angle β formed between an orthogonal projection of the axis "A" of the magnet on a second virtual plane YZ parallel to the second direction Y and the third direction Z, as a function of said second magnetic field gradient (dBy/dy or dBz/dy) and a second correction value (D1, D2, D4, D6, D8) related to the magnetic field strength of the magnet.

Step a) may comprise:

providing a semiconductor substrate with a sensor arrangement as shown in FIG. 5A, and measuring Bz1, Bz2, Bz3, Bz4 at four sensor locations; or providing a semiconductor substrate with a sensor arrangement as shown in FIG. 6 or FIG. 7, and measuring Bz1, Bz2, Bz3, Bz4, Bx5, By5, Bz5 at five sensor locations; or providing a semiconductor substrate with a sensor arrangement as shown in FIG. 8 or FIG. 9, and measuring Bx1, By1, Bz1, Bx2, By2, Bz2, Bx3, By3, Bz3, Bx4, By4, Bz4 at four sensor locations; or providing a semiconductor substrate with a sensor arrangement as shown in FIG. 11, and measuring Bz1, Bz2, Bz3, Bz4,Bz5 at five sensor locations; or providing a semiconductor substrate with a sensor arrangement as shown in FIG. 14, and measuring Bx1,By2,Bx3,By4,Bx5,By5 at five sensor locations.

Step b) may comprise determining dBzdx in the sensor arrangement of FIG. 5A, FIG. 6, FIG. 7, FIG. 8, FIG. 10, FIG. 11; or determining dBxdx in the sensor arrangement of FIG. 14.

Step c) may comprise determining dBzdy in the sensor arrangement of FIG. 5A, FIG. 6, FIG. 7, FIG. 8, FIG. 10, FIG. 11; or determining dBxdy in the sensor arrangement of FIG. 14.

The first correction value and the second correction value are preferably substantially proportional to the magnetic field strength of the method, and may be for example:

a predefined function of temperature (e.g. D1 in FIG. 5A);

a sum of squares of three orthogonal magnetic field components (Bx, By, Bz), e.g. D2 in FIG. 6 and FIG. 7;

a sum of squares of three orthogonal magnetic field gradients along the first direction (X), e.g. D3 in FIG. 8 and FIG. 10, or a sum of squares of three orthogonal magnetic field gradients along the second direction (Y) e.g. D4 in FIG. 8 and FIG. 10;

a second order gradient ($d^2Bx/dx^2$ or $d^2Bz/dx^2$) of the first magnetic field component (Bx; Bz) along the first direction (X), e.g. D5 in FIGS. 11 and D7 in FIG. 14; or a second order gradient ($d^2By/dy^2$ or $d^2Bz/dy^2$) of the second magnetic field component (By; Bz) along the second direction (Y), e.g. D6 in FIGS. 11 and D8 in FIG. 14.

FIG. 20 shows a flow chart of a method 2000, wherein the angles α and β are determined as a function of an out-of-plane magnetic field gradient (dBz/dx and dBz/dy) and a correction value (D1 to D4) indicative of the magnetic field strength of the magnet. The method 2000 is a special case of the method 1900 of FIG. 19, and can be used with sensor arrangements as illustrated in FIG. 5A, FIG. 6, FIG. 7, FIG. 8, and FIG. 10. The method 2000 comprises the following steps:

a) providing in step 2001 a silicon substrate comprising a plurality of magnetic sensors, and measuring a plurality of magnetic field components at a plurality of sensor locations;

b) determining in step 2002 a first magnetic field gradient (dBz/dx) of a magnetic field component (Bz) oriented in a direction (Z) perpendicular to a substrate, along a first direction (X) parallel to the substrate;

c) determining in step 2003 a second magnetic field gradient (dBz/dy) of said magnetic field component (Bz) oriented in said direction (Z) perpendicular to a substrate, along a second direction (Y) parallel to the substrate and perpendicular to the first direction (X);

d) determining in step 2004 a first angle (α) formed between an orthogonal projection of the axis (A) of a magnet on a first plane (XZ) parallel to the first direction (X) and the third direction (Z), as a function of said first magnetic field gradient (dBz/dx) and a first correction value (D1, D2, D3) indicative of a magnetic field strength of the magnet;

e) determining in step 2005 a second angle (β) formed between an orthogonal projection of the axis (A) of the magnet on a second plane (YZ) parallel to the second direction (Y) and the third direction (Z), as a function of said second magnetic field gradient (dBz/dy) and a second correction value (D1, D2, D4) indicative of a magnetic field strength of the magnet.

FIG. 21 shows a flow chart of a method 2100, wherein the angles α and β are determined as a function of a first order gradient and a second order gradient. The method 2100 is also a special case of the method 1900 of FIG. 19, and can be used with sensor arrangements as illustrated in FIG. 11 and FIG. 14. The method 2100 comprises the following steps:

a) providing in step 2101 a silicon substrate comprising a plurality of magnetic sensors, and measuring a plurality of magnetic field components at a plurality of sensor locations;

b) determining in step 2102 a first magnetic field gradient (dBx/dx or dBz/dx) of a first magnetic field component (Bx or Bz) oriented in a first direction (X) parallel to a semiconductor substrate or oriented in a third direction (Z) perpendicular to said substrate, along said first direction (X);

c) determining in step 2103 determining a second magnetic field gradient (dBy/dy or dBz/dy) of a second magnetic field component (By or Bz) oriented in a second direction (Y) parallel to the semiconductor substrate and orthogonal to the first direction (X) or oriented in the third direction (Z) perpendicular to said substrate, along said second direction (Y);

d) determining in step 2104 determining a first angle (α) formed between an orthogonal projection of the axis (A) of a magnet on a first plane (XZ) parallel to the first direction (X) and the third direction (Z), as a function of said first magnetic field gradient (dBx/dx or dBz/dx) and a second order gradient ($d^2Bx/dx^2$ or $d^2Bz/dx^2$) of the first magnetic field component (Bx or Bz) along the first direction (X);

e) determining in step 2105 determining a second angle (β) formed between an orthogonal projection of the axis (A) of the magnet on a second plane (YZ) parallel to the second direction (Y) and the third direction (Z), as a function of said second magnetic field gradient (dBy/dy or dBz/dy) and a second order gradient ($d^2By/dy^2$ or $d^2Bz/dy^2$) of the second magnetic field component (By or Bz) along the second direction (Y).

The invention claimed is:

1. A sensor device for determining an orientation of a magnet having an axis, the sensor device comprising:

a silicon substrate comprising a plurality of magnetic sensors;

a processing circuit configured for:

a) determining a first magnetic field gradient (dBz/dx) of a first magnetic field component (Bz) oriented in a third direction (Z) perpendicular to said silicon substrate, along a first direction (X) parallel to the silicon substrate;

b) determining a second magnetic field gradient (dBz/dy) of said first magnetic field component (Bz) oriented in the third direction (Z) perpendicular to said silicon substrate, along a second direction (Y) parallel to the silicon substrate and perpendicular to the first direction (X);

c) determining a first angle as a function of said first magnetic field gradient (dBz/dx) and a first correction value;

d) determining a second angle as a function of said second magnetic field gradient (dBz/dy) and a second correction value.

2. The sensor device according to claim 1,
wherein the first and the second correction value are selected from the group consisting of:
a predefined function of temperature, a sum of squares of three magnetic field components (Bx, By, Bz), a sum of squares of three magnetic field gradients (dBx/dx, dBy/dx, dBz/dx) along the first direction (X), and a sum of squares of three magnetic field gradients (dBx/dy, dBy/dy, dBz/dy) along the second direction (Y).

3. The sensor device according to claim 1,
wherein the sensor device is further configured for measuring a temperature; and
wherein step c) comprises: determining the first angle as a function of said first magnetic field gradient (dBz/dx) and a predefined function of temperature; and
wherein step d) comprises: determining the second angle as a function of said second magnetic field gradient (dBz/dy) and said predefined function of temperature.

4. The sensor device according to claim 1,
wherein the sensor device is further configured for measuring three orthogonal magnetic field components (Bx, By, Bz), and for determining a sum of squares of these magnetic field components; and
wherein step c) comprises: determining the first angle as a function of said first magnetic field gradient (dBz/dx) and said sum of squares; and
wherein step d) comprises: determining the second angle as a function of said second magnetic field gradient (dBz/dy) and said sum of squares.

5. The sensor device according to claim 1,
wherein the sensor device is further configured for determining three orthogonal magnetic field gradients (dBx/dx, dBy/dx, dBz/dx) along the first direction (X), and for determining a first sum of squares of these gradients; and
wherein the sensor device is further configured for determining three orthogonal magnetic field gradients (dBx/dy, dBy/dy, dBz/dy) along the second direction (Y), and for determining a second sum of squares of these gradients; and
wherein step c) comprises: determining the first angle as a function of said first magnetic field gradient (dBz/dx) and said first sum of squares; and
wherein step d) comprises: determining the second angle as a function of said second magnetic field gradient (dBz/dy) and said second sum of squares.

6. A position sensor system comprising:
a sensor device according to claim 1, the sensor device comprising said silicon substrate; and
a magnet pivotable about a reference point having a predefined position relative to the silicon substrate.

7. The position sensor system according to claim 6, wherein the system further comprises a joystick connected to the magnet.

8. A sensor device for determining an orientation of a magnet having an axis, the sensor device comprising:
a silicon substrate comprising a plurality of magnetic sensors;
a processing circuit configured for:
a) determining a first magnetic field gradient (dBx/dx; dBz/dx) of a first magnetic field component (Bx; Bz) oriented in a first direction (X) parallel to the silicon substrate or oriented in a third direction (Z) perpendicular to said silicon substrate, along said first direction (X);
b) determining a second magnetic field gradient (dBy/dy; dBz/dy) of a second magnetic field component (By; Bz)

oriented in a second direction (Y) parallel to the silicon substrate and perpendicular to the first direction (X) or oriented in the third direction (Z) perpendicular to said silicon substrate, along said second direction (Y);

c) determining a first angle as a function of said first magnetic field gradient (dBx/dx; dBz/dx) and a first correction value;

d) determining a second angle as a function of said second magnetic field gradient (dBy/dy; dBz/dy) and a second correction value;

wherein the sensor device is further configured for determining a second order gradient ($d^2Bx/dx^2$; $d^2Bz/dx^2$) of the first magnetic field component (Bx; Bz) along the first direction (X), and for determining a second order gradient ($d^2By/dy^2$; $d^2Bz/dy^2$) of the second magnetic field component (By; Bz) along the second direction (Y); and wherein step c) comprises: determining the first angle as a function of said first magnetic field gradient (dBx/dx; dBz/dx) and said second order gradient ($d^2Bx/dx^2$; $d^2Bz/dx^2$) of the first magnetic field component (Bx; Bz) along the first direction (X); and wherein step d) comprises: determining the second angle as a function of said second magnetic field gradient (dBy/dy; dBz/dy) and said second order gradient ($d^2By/dy^2$; $d^2Bz/dy^2$) of the second magnetic field component (By; Bz) along the second direction (Y).

9. The sensor device according to claim 8, wherein step a) comprises: determining a first magnetic field gradient (dBx/dx) of a first magnetic field component (Bx) oriented in a first direction (X) parallel to the silicon substrate, along said first direction (X); and wherein step b) comprises: determining a second magnetic field gradient (dBy/dy) of a second magnetic field component (By) oriented in a second direction (Y) parallel to the silicon substrate and perpendicular to the first direction (X), along said second direction (Y); and wherein step c) comprises: determining the first angle as a function of said first magnetic field gradient (dBx/dx) and said second order gradient ($d^2Bx/dx^2$) of the first magnetic field component (Bx) along the first direction (X); and wherein step d) comprises: determining the second angle as a function of said second magnetic field gradient (dBy/dy) and said second order gradient ($d^2By/dy^2$) of the second magnetic field component (By) along the second direction (Y).

10. The sensor device according to claim 8, wherein step a) comprises: determining a first magnetic field gradient (dBz/dx) of a first magnetic field component (Bz) oriented perpendicular to the silicon substrate, along said first direction (X); and wherein step b) comprises: determining a second magnetic field gradient (dBz/dy) of said first magnetic field component (Bz) oriented perpendicular to the silicon substrate, along said second direction (Y) perpendicular to the first direction; and wherein step c) comprises: determining the first angle as a function of said first magnetic field gradient (dBz/dx) and said second order gradient ($d^2Bz/dx^2$) of the first magnetic field component (Bz) along the first direction (X); and wherein step d) comprises: determining the second angle as a function of said second magnetic field gradient (dBz/dy) and said second order gradient ($d^2Bz/dy^2$) of said first magnetic field component (Bz) along the second direction (Y).

11. A method of determining an orientation of a magnet which is pivotable about a reference point having a predefined position relative to a silicon substrate, the method comprising:

a) providing a silicon substrate comprising a plurality of magnetic sensors, and measuring a plurality of magnetic field components at a plurality of sensor locations;

b) determining a first magnetic field gradient (dBz/dx) of a first magnetic field component (Bz) oriented in a third direction (Z) perpendicular to said silicon substrate, along a first direction (X) parallel to the silicon substrate;

c) determining a second magnetic field gradient (dBz/dy) of a second magnetic field component (Bz) oriented in the third direction (Z), along a second direction (Y) parallel to the silicon substrate and perpendicular to the first direction (X);

d) determining a first angle formed between an orthogonal projection of an axis of the magnet on a first virtual plane (XZ) parallel to the first direction (X) and the third direction (Z), as a function of said first magnetic field gradient (dBz/dx) and a first correction value;

e) determining a second angle formed between an orthogonal projection of the axis (A) of the magnet on a second virtual plane (YZ) parallel to the second direction (Y) and the third direction (Z), as a function of said second magnetic field gradient (dBz/dy) and a second correction value.

12. A method of determining an orientation of a magnet which is pivotable about a reference point having a predefined position relative to a silicon substrate, the method comprising:

a) providing a silicon substrate comprising a plurality of magnetic sensors, and measuring a plurality of magnetic field components at a plurality of sensor locations;

b) determining a first magnetic field gradient (dBx/dx; dBz/dx) of a first magnetic field component (Bx; Bz) oriented in a first direction (X) parallel to a silicon substrate or oriented in a third direction (Z) perpendicular to said substrate, along said first direction X c) determining a second magnetic field gradient (dBy/dy; dBz/dy) of a second magnetic field component (By; Bz) oriented in a second direction (Y) parallel to the silicon substrate and perpendicular to the first direction (X) or oriented in the third direction (Z), along said second direction (Y);

d) determining a first angle formed between an orthogonal projection of the axis of the magnet on a first virtual plane (XZ) parallel to the first direction (X) and the third direction (Z), as a function of said first magnetic field gradient (dBx/dx or dBz/dx) and a first correction value;

e) determining a second angle formed between an orthogonal projection of the axis (A) of the magnet on a second virtual plane (YZ) parallel to the second direction (Y) and the third direction (Z), as a function of said second magnetic field gradient (dBy/dy or dBz/dy) and a second correction value;

wherein the method further comprises: determining a second order gradient ($d^2Bx/dx^2$; $d^2Bz/dx^2$) of the first magnetic field component (Bx; Bz) along the first direction (X); and wherein the method further comprises: determining a second order gradient ($d^2By/dy^2$; $d^2Bz/dy^2$) of the second magnetic field component (By; Bz) along the second direction (Y); and wherein step d) comprises: determining the first angle as a function of said first magnetic field gradient (dBx/dx; dBz/dx) and said second order gradient ($d^2Bx/dx^2$; $d^2Bz/dx^2$) of the first magnetic field component (Bx; Bz) along the first direction (X); and wherein step e) comprises: determining the second angle as a function of said second magnetic field gradient (dBy/dy; dBz/dy) and said second order gradient ($d^2By/dy^2$; $d^2Bz/dy^2$) of the second magnetic field component (By; Bz) along the second direction (Y).

13. The method according to claim 12, wherein step b) comprises: determining a first magnetic field gradient (dBx/dx) of a first magnetic field component (Bx) oriented in a first direction (X) parallel to the silicon substrate, along said first direction (X); and step c) comprises: determining a second magnetic field gradient (dBy/dy) of a second magnetic field component (By) oriented in a second direction (Y) parallel to the silicon substrate and perpendicular to the first direction (X), along said second direction (Y); and step d) comprises: determining the first angle as a function of said first magnetic field gradient (dBx/dx) and said second order gradient ($d^2Bx/dx^2$) of the first magnetic field component (Bx) along the first direction (X); and step e) comprises: determining the second angle as a function of said second magnetic field gradient (dBy/dy) and said second order gradient ($d^2By/dy^2$) of the second magnetic field component (By) along the second direction (Y).

14. The method according to claim 12, wherein step b) comprises: determining a first magnetic field gradient (dBz/dx) of a first magnetic field component (Bz) oriented perpendicular to the silicon substrate, along said first direction (X); and step c) comprises: determining a second magnetic field gradient (dBz/dy) of said first magnetic field component (Bz) oriented perpendicular to the silicon substrate, along said second direction (Y) perpendicular to the first direction; and step d) comprises: determining the first angle as a function of said first magnetic field gradient (dBz/dx) and said second order gradient ($d^2Bz/dx^2$) of the first magnetic field component (Bz) along the first direction (X); and step e) comprises: determining the second angle as a function of said second magnetic field gradient (dBz/dy) and said second order gradient ($d^2Bz/dy^2$) of said first magnetic field component (Bz) along the second direction (Y).

\* \* \* \* \*